(12) United States Patent
Bedeschi et al.

(10) Patent No.: US 10,283,182 B2
(45) Date of Patent: May 7, 2019

(54) COMPENSATING FOR VARIATIONS IN SELECTOR THRESHOLD VOLTAGES

(71) Applicant: Micron Technology, Inc., Boise, ID (US)

(72) Inventors: Ferdinando Bedeschi, Biassono (IT); Umberto Di Vincenzo, Capriate san Gervasio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/951,006

(22) Filed: Apr. 11, 2018

(65) Prior Publication Data

US 2018/0294025 A1 Oct. 11, 2018

Related U.S. Application Data

(63) Continuation of application No. 15/291,711, filed on Oct. 12, 2016, now Pat. No. 9,966,127.

(51) Int. Cl.
*G11C 11/22* (2006.01)

(52) U.S. Cl.
CPC ........ *G11C 11/2259* (2013.01); *G11C 11/221* (2013.01); *G11C 11/2273* (2013.01); *G11C 11/2275* (2013.01); *G11C 11/2293* (2013.01); *G11C 11/2277* (2013.01)

(58) Field of Classification Search
CPC ... G11C 11/22; G11C 11/2273; G11C 11/221; G11C 11/2297
USPC .......................... 365/145, 109, 117, 129, 149
See application file for complete search history.

(56) References Cited

U.S. PATENT DOCUMENTS

| | | |
|---|---|---|
| 9,715,918 B1 | 7/2017 | Kawamura |
| 9,734,886 B1 | 8/2017 | Derner et al. |
| 9,966,127 B2 * | 5/2018 | Bedeschi ............ G11C 11/2259 |

* cited by examiner

*Primary Examiner* — Gene N Auduong
(74) *Attorney, Agent, or Firm* — Holland & Hart LLP

(57) ABSTRACT

Methods, systems, and devices are described for operating a memory array. A first voltage may be applied to a memory cell to activate a selection component of the memory cell prior to applying a second voltage to the memory cell. The second voltage may be applied to facilitate a sensing operation once the selection component is activated. The first voltage may be applied during a first portion of an access operation and may be used in determining a threshold voltage of the selection component. The subsequently applied second voltage may be applied during a second portion of the access operation and may have a magnitude associated with a preferred voltage for accessing a ferroelectric capacitor of the memory cell. In some cases, the second voltage has a greater rate of increase over time (e.g., a greater "ramp") than the first voltage.

20 Claims, 11 Drawing Sheets

COMPENSATING FOR VARIATIONS IN SELECTOR THRESHOLD VOLTAGES

CROSS-REFERENCES

The present application for Patent is a continuation of U.S. patent application Ser. No. 15/291,711 by Bedeschi et al., entitled "Compensating for Variations in Selector Threshold Voltages," filed Oct. 12, 2016, now U.S. Pat. No. 9,966,127, issued May 8, 2018, assigned to the assignee hereof, expressly incorporated by reference in its entirety herein.

TECHNICAL FIELD

The following relates generally to memory devices and more specifics compensating for variations in threshold voltages of selection components.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

In some memory architectures, a memory cell may include a storage element and a selection component. The selection component may be activated by applying a voltage across the selection component that activates the selection component allowing current to flow through the memory cell. The voltage necessary to activate the selection component may be referred to as a threshold voltage. The threshold voltage of the selection component may affect the voltage applied across the storage element; the voltage across storage element may equal the voltage across the memory cell minus the voltage across the selection component. In some examples, the threshold voltage may vary from one selection component to another (e.g., due to local temperatures, aging, process variations, etc.), causing a voltage applied across the storage element (e.g., a read or write voltage) to vary as well. In some examples, the threshold voltage of a selection component itself may vary over time.

BRIEF DESCRIPTION OF THE DRAWINGS

The disclosure herein refers to and includes the following figures.

DETAILED DESCRIPTION

Figure 1:
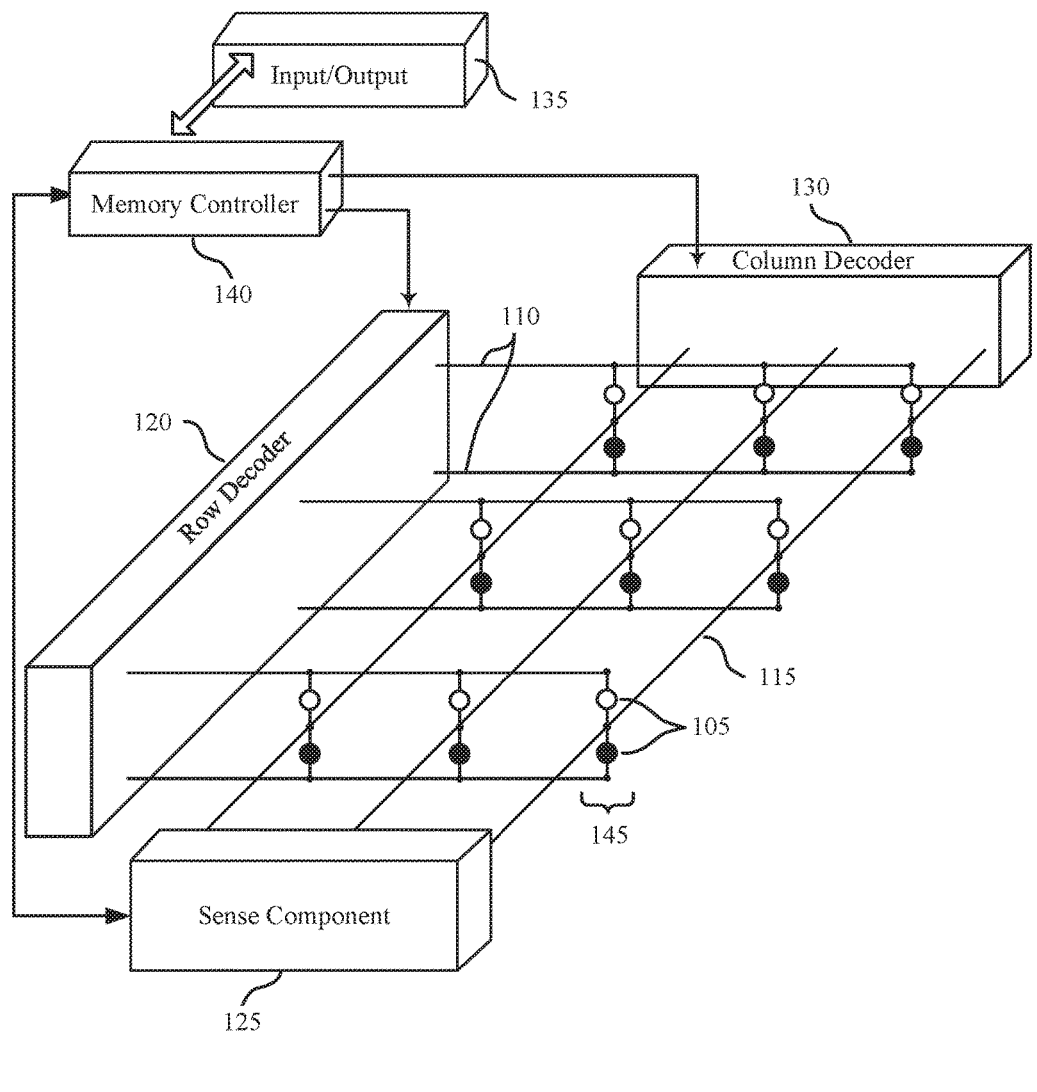
FIG. 1 illustrates an example memory array that supports compensating for variations in threshold voltages of selection components in accordance with various embodiments of the present disclosure.

An initial voltage may be applied across a memory cell to activate a selection component of the memory cell prior to applying a subsequent voltage across the memory cell for a read or write operation. The subsequent voltage may be larger in magnitude than the initial voltage and may represent a preferred or more optimized voltage for sensing or storing a logic state from or to a capacitor of the memory cell. An absolute value of the initial voltage may be increased until the threshold voltage of the selection component is reached, and then the subsequent voltage may be applied at a level sufficient to access the memory cell but without over-voltaging the cell. In this way, variations in threshold voltages of different selection components located on the same or different memory arrays may be accounted for.

Memory cells of a memory array may be accessed (e.g., read or written) by applying an access voltage across the memory cell. An access voltage may include both the initial voltage (or a first voltage) and a voltage for accessing the memory cell. The performance of the memory cells may be dependent on a magnitude of the access voltage applied across a memory cell. For example, larger access voltages may stress (e.g., overvoltage) a ferroelectric capacitor of a memory cell, decreasing the life of the memory cell. While lower access voltages may fail to fully discharge the ferroelectric capacitor, resulting in a decreased sensing window and potentially an increase in failed read and write operations.

In some cases, a predetermined access voltage is applied across the memory cell that takes into account both a voltage to be applied across a capacitor to facilitate an access operation and an average threshold voltage associated with a corresponding selection component. And the portion of the predetermined access voltage that is ultimately applied across the ferroelectric capacitor of the memory cell (which may be referred to as the "capacitor voltage") may be dependent on the magnitude of the actual threshold voltage of the corresponding selection component. For instance, if the actual threshold voltage is smaller than expected, then the capacitor voltage may be greater than desired, and if the actual threshold voltage is greater than expected, then the capacitor voltage may be less than desired.

In some examples, this threshold voltage variation is compensated for by applying the initial voltage across the memory cell so that the initial voltage increases over time until the threshold voltage of the selection component is reached and the selection component is activated. The voltage applied across the memory cell at which the selection component is activated may be referred to as an "activation voltage". After the threshold voltage of the selection component has been reached, the voltage applied across the memory cell may be increased by a capacitor voltage to an access voltage. In this way, the threshold voltage of an individual selection component may be identified prior to applying the capacitor voltage, and most or all of the capacitor voltage may be applied across a ferroelectric capacitor of a memory cell. In some cases, the voltage applied across the memory cell may increase from the activation voltage to the access voltage at a greater rate than the application of the activation voltage.

In some examples, a determination, either implicit or explicit, that the threshold voltage has been reached may be used to trigger the application of the capacitor voltage. For instance, the determination that the threshold voltage of the selection component has been reached may be accomplished by detecting that a certain level of current (e.g., 1 µA) is passing or has passed through the memory cell. In some examples, a comparator (e.g., a trip-point comparator) may be used in combination with a voltage of a charge accumulator and a number of switches to detect that the threshold voltage of the selection component has been reached. The switches may be used to initialize the detection process (e.g., by setting up a voltage to compare with the voltage of the charge accumulator), and the voltage of the charge accumulator may control the output voltage of the comparator, which may be used to trigger the application of the capacitor voltage. In some examples, the same comparator may also be used to read a logic state from a memory cell in place of a sense component. For instance, the comparator may be re-initialized after detecting the threshold voltage has been reached, but may be used to determine a logic state of the memory cell instead. In some cases, the comparator may also be used to mite a logic state to the memory cell.

Features and techniques introduced above are further described below in the context of a memory array. Specific examples are then described for compensating for variations in threshold voltages of selection components after accessing a target memory cell. These and other features of the disclosure are further illustrated by and described with reference to apparatus diagrams, system diagrams, and flowcharts that relate to reading or writing non-volatile memory cells.

FIG. 1 illustrates an example memory array 100 in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted a logic 0 and a logic 1. In some cases, memory cell 105 is configured to store more than two logic states. A memory cell 105 may store charge representative of the programmable states in a capacitor; for example, a charged and uncharged capacitor may represent two logic states, respectively. DRAM architectures may commonly use such a design, and the capacitor employed may include a dielectric material with linear or paraelectric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Memory array 100 may be a three-dimensional (3D) memory array, where, for example, two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145.

Each row of memory cells 105 is connected to an access line 110, and each column of memory cells 105 is connected to a bit line 115. Access lines 110 may also be known as word lines 110, and bit lines 115 may also be known digit lines 115. References herein to word lines and bit lines, or their analogues, are interchangeable without loss of understanding or operation. Word lines 110 and bit lines 115 may be substantially perpendicular to one another to create an array.

As shown in FIG. 1, the two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. Other configurations may be possible, for example, a third layer may share a word line 110 with a lower layer. In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, a word line 110 and bit line 115 may be energized in order to read or write a memory cell 105 at their intersection. Other memory cells 105 that are in electronic communication with (e.g., connected to) the same word line 110 or bit line 115 may be referred to as untargeted memory cells 105.

As discussed above, electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting a word line 110 and bit line 115, which may include applying a voltage or a current to the respective line. Word lines 110 and bit lines 115 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds. Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate bit line 115. Thus, by activating a word line 110 and a bit line 115, a memory cell 105 may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as input/output 135. In some cases, sense component 125 may be a part of column decoder 130 or row decoder 120. Or, sense component 125 may be connected to or in electronic communication with column decoder 130 or row decoder 120.

A memory cell 105 may be set, or written, by similarly activating the relevant word line 110 and bit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. In some cases, the ferroelectric memory cell 105 includes a selection component for accessing a ferroelectric capacitor of the ferroelectric memory cell 105. The selection component may be activated by applying an initial voltage that is greater than or equal to a threshold voltage of the selection component across the selection component.

In order to apply a desired voltage across the ferroelectric capacitor (e.g., a capacitor voltage that is a preferred voltage for sensing or writing a logic state from or to the ferroelectric capacitor) during an access operation, the voltage plus the threshold voltage (i.e., the access voltage) may be applied across the ferroelectric memory cell 105. However, the threshold voltage of one selection component is oftentimes different than that of other selection components of memory array 100 or may even vary itself over time (e.g., due to aging, temperature, process variations, etc.). Therefore, the initial voltage may be equal to an average threshold voltage that is determined for multiple selection components. Thus, the access voltage applied across the ferroelectric memory cell 105 may be predetermined and equal to the average threshold voltage plus the capacitor voltage. But this approach may introduce inconsistencies in the capacitor voltages applied across different ferroelectric capacitors in the memory array 100, and in some cases, may reduce performance and/or increase errors (e.g., read/write errors).

In some examples to compensate for variations in threshold voltage, an initial voltage may be applied across a ferroelectric memory cell 105, where the initial voltage may start at a first voltage (e.g., 0V) and may increase over time to a second voltage, which may be referred to as an "activation voltage"—a voltage that activates a selection component of the ferroelectric memory cell 105. Once the activation voltage is reached, the access voltage may be applied across the ferroelectric memory cell 105 by increasing the activation voltage applied across the ferroelectric memory cell 105 by an additional capacitor voltage. Since the actual threshold voltage of the selection component has already been reached by applying the appropriate activation voltage, most or all of the additional capacitor voltage may be applied across a ferroelectric capacitor of the ferroelectric memory cell 105 with limited effect from the actual voltage drop across the selection component.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltage potentials or currents used during the operation of memory array 100. For example, it may apply discharge voltages to a word line 110 or bit line 115 after accessing one or more memory cells 105. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some examples, the memory controller 140 may be used to implement aspects of threshold voltage compensation in the memory array 100. For instance, the memory controller 140 may be used to apply a first voltage (e.g., an activation voltage) across a memory cell 105 that includes a selection component during a first portion of an access operation until a threshold voltage of the selection component is reached. And memory controller 140 may apply a second voltage (e.g., an access voltage) across the memory cell 105 during a second portion of the access operation. In some cases, the activation voltage may increase over time at a first rate and the second voltage may increase over time at a second rate, the second rate being different than (e.g., greater or less than) the first rate. The memory controller 140 may also be used to determine when the threshold voltage of the selection component is reached. In some examples, a comparator may be used independently from or in combination with the memory controller 140 to determine when the threshold voltage of the selection component is reached.

Figure 2:
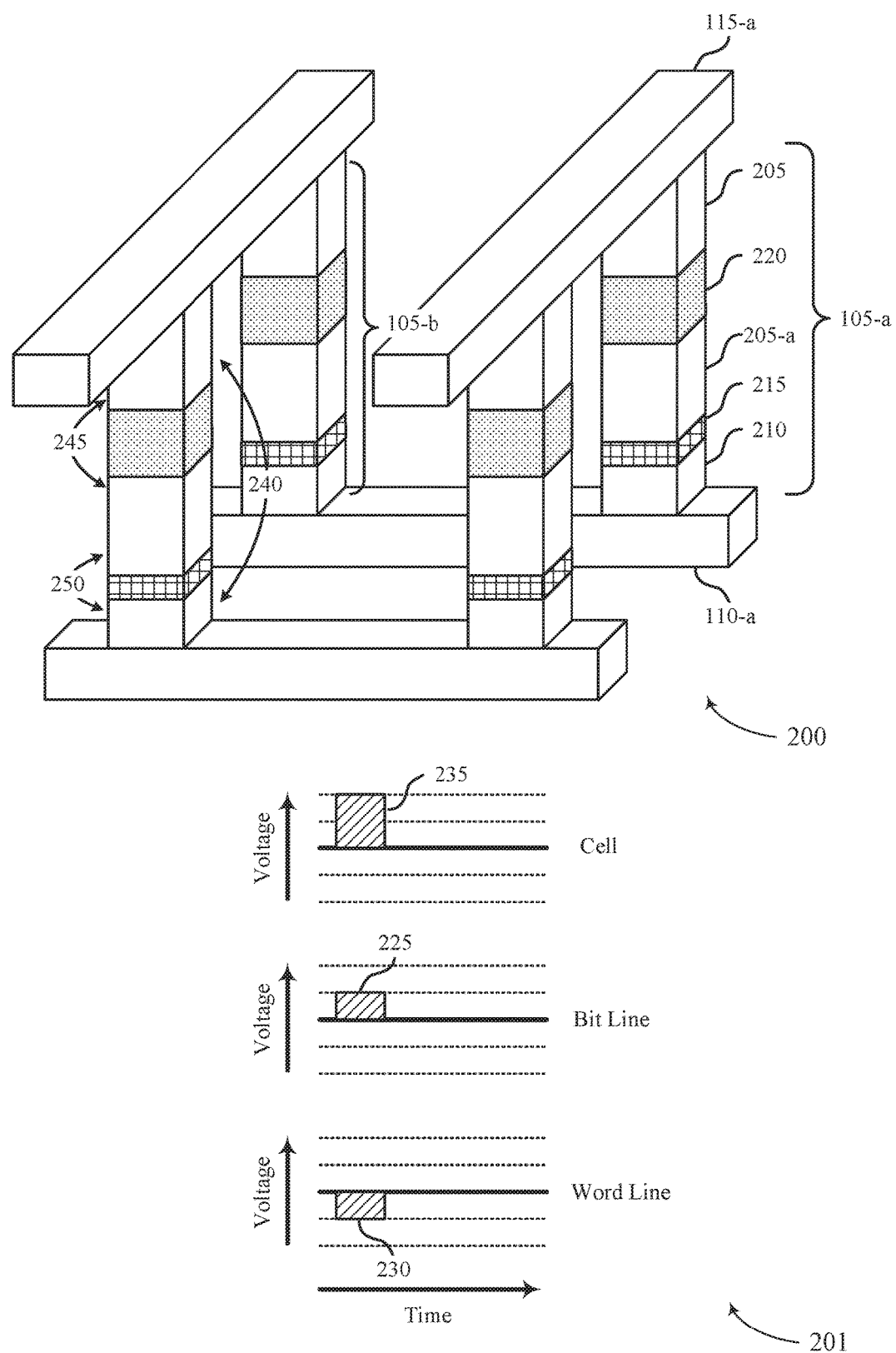
FIG. 2 illustrates an example memory array and plots of voltages within the array that support compensating for variations in threshold voltages of selection components in accordance with various embodiments of the present disclosure.

FIG. 2 illustrates an example memory array 200 and an example voltage plot 201 that supports reading and writing non-volatile memory cells and compensating for variations in threshold voltages of selection components in accordance with various embodiments of the present disclosure. Memory array 200 may be an example of memory array 100 with reference to FIG. 1. Memory array 200 includes memory cell 105-a, memory cell 105-b, word line 110-a, and bit line 115-a, which may be examples of a memory cell 105, word line 110, and bit line 115, as described with reference to FIG. 1. Memory cell 105-a includes electrode 205, electrode 205-a, and memory element 220, which may be a ferroelectric material. Electrode 205-a of memory cell 105-a may be referred to as middle electrode 205-a. Memory array 200 also includes bottom electrode 210 and selection component 215. In some cases, a 3D memory array may be formed by stacking multiple memory arrays 200 on one another. The two stacked arrays may, in some examples, have common conductive lines such that each level may share word lines 110 or bit lines 115 as described with reference to FIG. 1. Memory cell 105-a may be a target memory cell.

The architecture of memory array 200 may be referred to as a cross-point architecture. It may also be referred to as a pillar structure. For example, as shown in FIG. 2, a pillar may be in contact with a first conductive line (word line 110-a) and a second conductive line (bit line 115-a), where the pillar comprises a first electrode (bottom electrode 210), selection component 215, and ferroelectric memory cell 105-a, where ferroelectric memory cell 105-a includes a second electrode (electrode 205-a), ferroelectric memory element 220, and a third electrode (electrode 205). In some cases, electrode 205-a may be referred to as a middle electrode.

Such a pillar architecture may offer relatively high-density data storage with lower production costs compared to other memory architectures. For example, the cross-point architecture may have memory cells with a reduced area and, resultantly, an increased memory cell density compared to other architectures. For example, the architecture may have a $4F^2$ memory cell area, where F is the smallest feature size, compared to other architectures with a $6F^2$ memory cell area, such as those with a three-terminal selection. For example, DRAM may use a transistor, which is a three-terminal device, as the selection component for each memory cell and may have a larger memory cell area compared to the pillar architecture.

Selection component 215 may, in some cases, be connected in series between a memory cell 105 and a conductive line, for example, between memory cell 105-a and at least one of word line 110-a or bit line 115-a. For example, as depicted in FIG. 2, selection component 215 may be located between electrode 205-a and bottom electrode 210; thus, selection component 215 is located in series between memory cell 105-a and word line 110-a. Other configurations are possible. For example, selection component may be located in series between memory cell 105-a and bit line 115-a. The selection component may aid in selecting a particular memory cell 105-a or may help prevent stray currents from flowing through non-selected memory cells 105-a adjacent a selected memory cell 105-a. It may also reduce the bias across untargeted memory cells, such as memory cell 105-b. For example, selection component 215 may have a threshold voltage such that a current flows through selection component 215 when the threshold voltage is met or exceeded. In some cases, selection component 215 may have a threshold voltage that is different from the other selection components in a memory array (e.g., due to aging, process variations, temperature, etc.)

Selection component 215 may be an electrically non-linear component (e.g., a non-ohmic component) such as a metal-insulator-metal (MIM) junction, an ovonic threshold switch (OTS), or a metal-semiconductor-metal (MSM) switch, among other types of two-terminal select device such as a diode. In some cases, selection component 215 is a chalcogenide film, for example, an alloy of selenium (Se), arsenic (As), and germanium (Ge). Selection component 215 may be separated from memory element 220 by middle electrode 205-a. As such, middle electrode 205-a may electrically float—that is, charge may accumulate because it may not be directly connected to an electrical ground or a component capable of being electrically grounded.

Memory array 200 may be made by various combinations of material formation and removal. For example, layers of material may be deposited that correspond to the word line 110-a, bottom electrode 210, selection component 215, electrode 205-a, memory element 220, and electrode 205. Material may be selectively removed to then create the desired features, such as the pillar structure depicted in FIG. 2. For example, features may be defined using photolithography to pattern a photoresist and then material may be removed by techniques such as etching. Bit lines 115-a may then be formed, for example, by depositing a layer of material and selectively etching to form the line structure depicted in FIG. 2. In some cases, electrically insulating regions or layers may be formed or deposited. The electrically insulating regions may include oxide or nitride materials, such as silicon oxide, silicon nitride, or other electrically insulating materials.

Various techniques may be used to form materials or components of memory array 200. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

Voltage plot 201 depicts voltages applied as a function of time during an access operation of a target memory cell 105. Prior to accessing a memory cell, such as memory cell 105-a, both the word line 110-a and digit line 115-a may be maintained at an inhibit voltage 240—i.e., a voltage that prevents discharging of the memory cell 105-a. For instance, both the word line 110-a and digit line 115-a may be maintained at an inhibit voltage that is equivalent to a virtual ground. To access memory cell 105-a, both the word line 110-a and digit line 115-a may be energized by applying a voltage to them. That is, bit line access voltage 225 may be applied at the same time as word line access voltage 230. Because they have opposite polarities, the voltages applied to the word line 110-*a* and digit line 115-*a* may be additive, and the resulting voltage applied to target memory cell 105-*a* is cell access voltage 235. That is, in voltage plot 201, bit line access voltage 225 has a positive polarity and word line access voltage 230 has a negative polarity, and the net sum across memory cell 105-*a* is cell access voltage 235. In some embodiments, the polarity of the bit line access voltage 225 and the word line access voltage 230 may be exchanged, so that the polarity of cell access voltage 235 is reversed.

In some examples, the inhibit voltage may be an intermediary voltage, for example a mid-bias voltage. That is, instead of applying a positive bit line access voltage 225 and a negative word line access voltage 230 relative to a virtual ground, the bit line access voltage 225 and the negative word line access voltage 230 may be applied relative to an intermediary voltage. For instance, the memory array may be operated using only a positive voltage source and the magnitude of the intermediary voltage is between the magnitude of the positive voltage source and a virtual ground. In some examples, both bit line access voltage 225 and word line access voltage 230 are maintained at the intermediary voltage prior to an access operation of memory cell 105-*a*. And during an access operation, bit line access voltage 225 may be increased (e.g., to a positive supply rail) while word line access voltage 230 may be simultaneously decreased (e.g., to a virtual ground), generating a net voltage across memory cell 105-*a*.

In some cases, the net voltage across a memory cell 105 may be equivalent to an access voltage 240, which may be used for reading or writing a memory cell 105. Access voltage 240 may include subsequent voltage 245 and initial voltage 250. Subsequent voltage 245 may be the portion of the access voltage 240 applied across the ferroelectric memory element 220 and initial voltage 250 may be the portion of the access voltage 240 applied across the selection component 215. As discussed above, the threshold voltage may vary from one selection component 215 to another, and this variation may cause variations in subsequent voltage 245. Variations in subsequent voltage 245 may result in reduced life of ferroelectric memory element 220 (e.g., due to overvoltage) or decreased read/write errors (e.g., due to decreased sensing windows and/or soft write conditions).

Thus, a time-increasing voltage may be applied across the memory cell 105 until the threshold voltage of the corresponding selection component 215 has been activated. For example, the bit line access voltage 225 may be increased and maintained at a fixed voltage, while the word line access voltage 230 may then be decreased over time (e.g., linearly, exponentially, logarithmically, etc.) until the selection component 215 is activated. In some cases, the fixed voltage may be such that the magnitude of the fixed voltage does not trigger access of other memory cells 105 connected to a common bit line. Accordingly, the access voltage 240 may increase as a function of the decrease in the word line access voltage 230. While the selection component 215 is not activated, the initial voltage 250 may be equivalent to the access voltage 240 and the voltage across the memory element 220 may be zero. In some cases, the polarity of the bit line access voltage 225 and the word line access voltage 230 may be exchanged, so that the polarity of access voltage 240 is reversed.

Once it is determined that the selection component 215 has been activated, word line access voltage 230 may be supplemented with a capacitor voltage, which may be a preferred voltage for sensing or writing a logic state from or to a memory element 220. At this point in time, the initial voltage 250 may remain at or near the threshold voltage, and thus, all or a large portion of the capacitor voltage may be applied directly across memory element 220, which may be measured across the memory element 245 as subsequent voltage 245. By activating the selection component 215 prior to applying the capacitor voltage, the actual threshold voltage of the selection component 215 may be determined and effects from variations in selection component threshold voltages may be mitigated.

In some cases, the above process may be similarly used to write back or write logic states to a memory cell 105. For instance, the word line access voltage 230 may be increased until the selection component 215 is activated—e.g., until a reverse breakdown voltage of the selection component is reached—and a first, negative voltage (or activation voltage) is applied across the memory cell 105. Subsequently, the bit line access voltage 225 may be decreased, and the voltage across the memory cell 105 may be further decreased to a second voltage (or access voltage). The difference between the access voltage and the activation voltage may be equivalent to a preferred voltage (or capacitor voltage) for writing to a memory cell 105 In some cases the decrease from the activation voltage to the access voltage may occur at a quicker rate than the decrease to the activation voltage.

Figure 3:
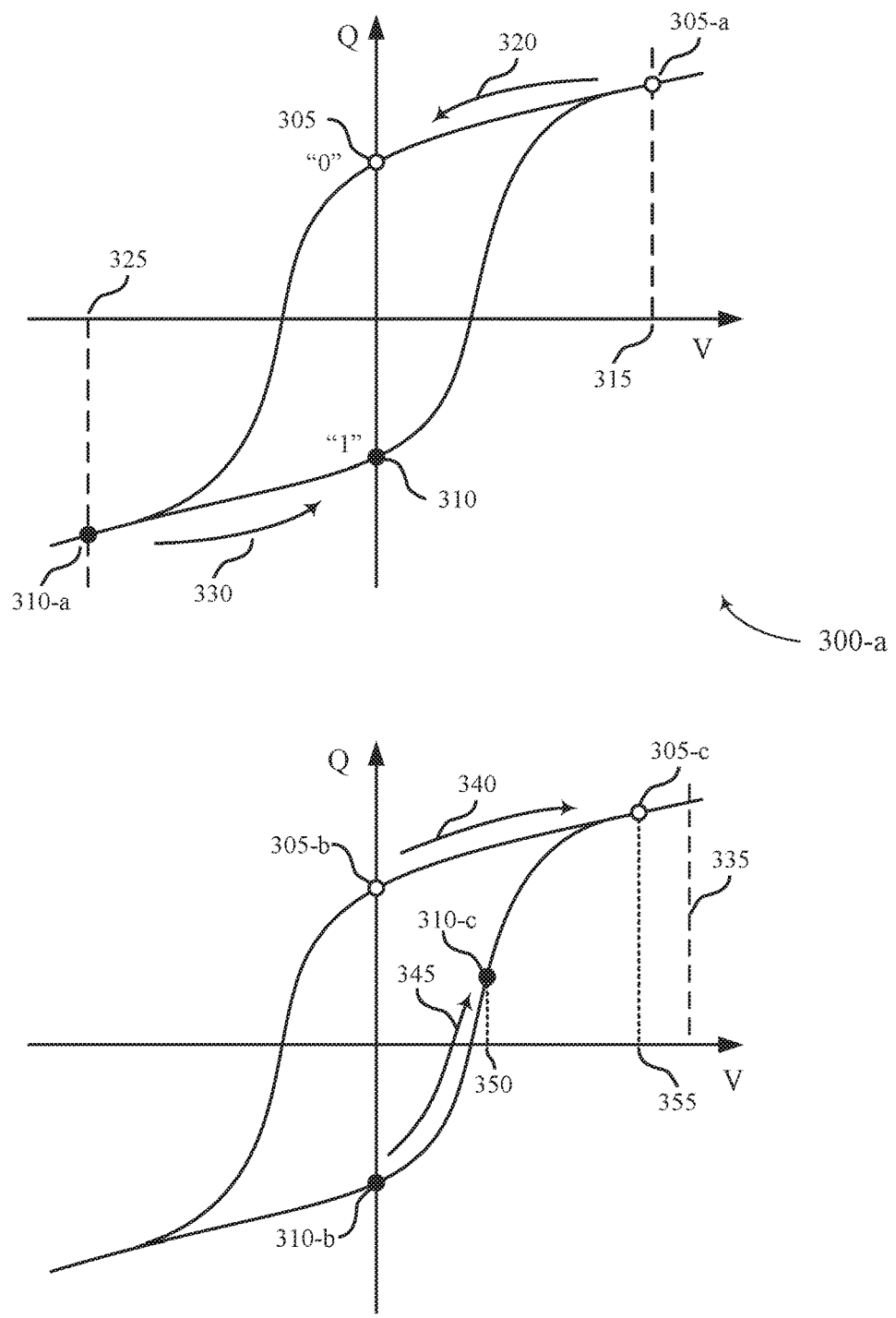
FIG. 3 illustrates example hysteresis plots for a ferroelectric memory cell that support compensating for variations in threshold voltages of selection components in accordance with various embodiments of the present disclosure.

FIG. 3 illustrates an example of non-linear electrical properties with hysteresis curves 300-*a* and 300-*b* for a ferroelectric memory cell that is operated in accordance with various embodiments of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., memory element 220 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a top electrode 205) and maintaining the second terminal (e.g., middle electrode 205-*a*) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, a memory cell includes the capacitor and a selection component that is activated based on its threshold voltage. The voltage 335 across the capacitor may thus be a voltage applied across the memory cell minus the threshold voltage of the selection component. For example, a word line may be associated with a first terminal of the capacitor and a bit line may be associated with a second terminal of the capacitor, which may be the terminal in question. Subsequently, a first voltage may be applied to the bit line and a second voltage may be applied to the word line, and the difference between the voltage at the bit line and the voltage at the word line may equal an access voltage for the memory cell. The resulting net voltage across the capacitor may equal the bit line voltage–(the threshold voltage+the word line voltage) or the access voltage minus the threshold voltage. Deviations in the actual threshold voltage of a selection component from an average threshold voltage may thus dictate the amount of voltage applied across the capacitor. For instance, if the actual threshold voltage is greater than the average threshold voltage, which may damage the capacitor, then the voltage 335 applied across the capacitor may be reduced. Conversely, if the actual threshold voltage is less than the average threshold voltage, which may result in a reduced sensing window, then the voltage 335 applied across the capacitor may be smaller. Thus, the actual threshold voltage of a specific selection component may be determined prior to applying a full access voltage to a memory cell to compensate for variations in the threshold voltage.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335–voltage 350) or (voltage 335–voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335–voltage 350) and (voltage 335–voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

Figure 4A:
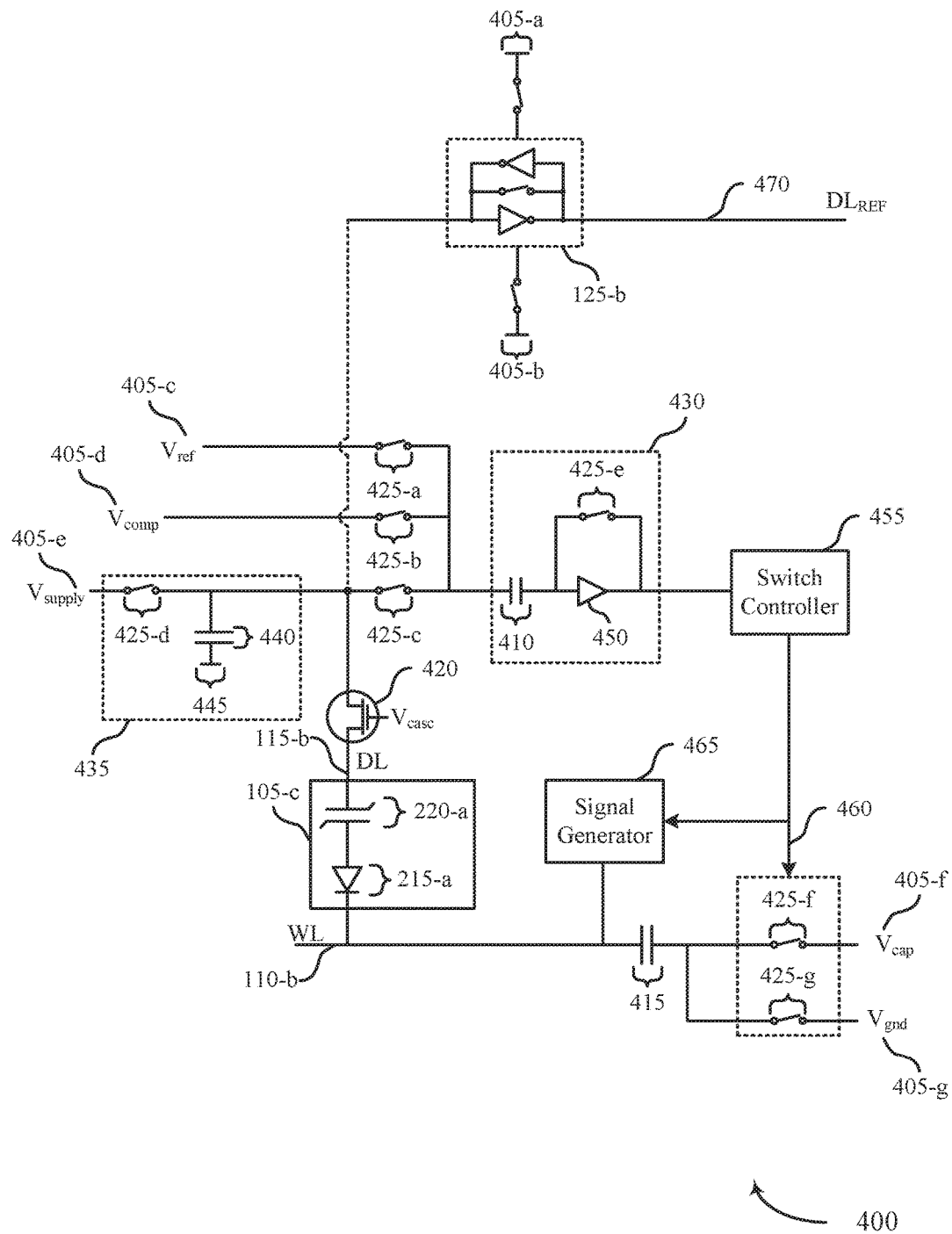
FIGS. 4A-4D illustrate example circuits that support compensating for variations in threshold voltages of selection components in accordance with various embodiments of the present disclosure.

FIG. 4A illustrates an example circuit 400 that supports compensating for variations in threshold voltages of selection components in accordance with various embodiments of the present disclosure. Circuit 400 includes memory cell 105-c, word line 110-b (which may also be referred to as a first access line), digit line 115-b (which may also be referred to as a second access line), and sense component 125-b, which may be examples of a memory cell 105, word line 110, digit line 115, and sense component 125, respectively, described with reference to FIGS. 1 and 2. Memory cell 105-c may include a ferroelectric capacitor that operates with characteristics as described with reference to FIG. 3. Circuit 400 also includes voltage sources 405-a to 405-g, cascade driver 420, switching components 425-a to 425-g, comparator 430, and charge accumulator 435.

For ease of reference, voltage source 405-c may be referred to as reference voltage source 405-c, voltage source 405-d may be referred to as compensation voltage source 405-*d*, voltage source 405-*e* may be referred to as supply voltage source 405-*e*, voltage source 405-*f* may be referred to as capacitor voltage source 405-*f*, and voltage source 405-*g* may be referred to as ground voltage source 405-*g*.

As depicted, ferroelectric memory cell 105-*c* is in electronic communication with digit line 115-*b*. Ferroelectric memory cell 105-*c* may include a selection component 215-*a* (depicted as a diode in FIG. 4A) and a ferroelectric capacitor as a memory element 220-*a*, as described with reference to FIG. 2. The selection component 215-*a* may be activated by applying a voltage across the ferroelectric memory cell 105-*c* that is equal or greater than a threshold voltage of selection component 215-*a*, and may be used to provide a conductive path to the word line 110-*b*. In one example, ferroelectric memory cell 105-*c* may be selected, by applying a voltage across the ferroelectric memory cell 105-*c* that is equal or greater than the threshold voltage, for a read operation to determine a logic state stored by the memory element 220-*a* or a write operation to store a logic state at the memory element 220-*a*. In some examples, a memory array simultaneously accesses a set of memory cells, or a "page" that includes ferroelectric memory cell 105-*c*. A page may be associated with and accessed using a unique address.

Reference voltage source 405-*c* may be used to provide a reference voltage to a first terminal of capacitor 410 via switching component 425-*a*. In some cases, the voltage provided by reference voltage source 405-*c* is used by comparator 430 in determining a logic state stored by memory cell 105-*c*. Compensation voltage source 405-*d* may be used to provide a compensation voltage to a first terminal of capacitor 410 via switching component 425-*b*. In some cases, the voltage provided by compensation voltage source 405-*d* is used by comparator 430 in determining when a threshold voltage of selection component 215-*a* has been reached. Supply voltage source 405-*e* may be used to provide a voltage to charge accumulator 435 via switching component 425-*d*.

Capacitor voltage source 405-*f* may be used to provide a capacitor voltage to a second terminal of capacitor 415 via switching component 425-*f*. The capacitor voltage may be associated with a preferred voltage to apply across memory element 220-*a* during an access operation. Ground voltage source 405-*g* may be used to provide a ground voltage to a second terminal of capacitor 415 via switching component 425-*g*. Circuit 400 may apply the capacitor voltage to memory cell 105-*c* during a second portion of an access operation by toggling between capacitor voltage source 405-*f* and ground voltage source 405-*g* after determining that a threshold voltage of selection component 215-*a* has been reached. When the capacitor voltage source 405-*g* is applied to the second terminal of capacitor 415, the voltage across memory cell 105-*c* may be equivalent to the threshold voltage of selection component 215-*a* plus the voltage of capacitor voltage source 405-*f*.

Switching components 425-*a* to 425-*g* may be used to connect and isolate certain circuit locations from other circuit locations. In some cases, switching components 425-*a* through 425-*g* may be activated/deactivated in a pattern that enables detection of when selection component 215-*a* is activated, the subsequent application of a capacitor voltage, and/or the detection of the logic state stored by memory cell 105-*c*, as will be discussed in more detail below. In some cases, switching component 425-*a* may be referred to as a first switching component, and may be in electronic communication with reference voltage source 405-*c* and comparator 430. Switching component 425-*b* may be referred to as a second switching component, and may be in electronic communication with compensation voltage source 405-*d* and comparator 430. Switching component 425-*c* may be referred to as a third switching component, and may be in electronic communication with charge accumulator 435 and comparator 430. Switching component 425-*d* may be referred to as a fourth switching component, and may be in electronic communication with supply voltage source 405-*e* and capacitor 440. Switching component 425-*e* may be referred to as a fifth switching component, and may be in electronic communication with the input and output of trip-point comparator 450. Switching component 425-*f* may be in electronic communication with capacitor 415 and capacitor voltage source 405-*f*. Switching component 425-*f* may be in electronic communication with capacitor 415 and ground voltage source 405-*g*.

Capacitor 410 may be in electronic communication with comparator 430 and switching components 425-*a*, 425-*b*, and 425-*c*. Capacitor 410 may be used to store an initial voltage that may be used in combination with the voltage of charge accumulator 435 to determine when the threshold voltage of selection component 215-*a* is reached and/or to determine a logic state stored by ferroelectric memory cell 105-*c*.

Comparator 430 may include a switching component 425-*e* and a trip-point comparator 450. Switching component 425-*e* may be used to electrically connect an output of the trip-point comparator 450 to the input of the trip-point comparator 450 and a second terminal of capacitor 410. Connecting the output and the input of trip-point comparator 450 together may result in the voltage measured at the input and output lines to equal the trip-point voltage (i.e., the voltage that determines whether the output of the comparator is high or low). In some examples, the trip-point comparator 450 has an intrinsic trip voltage. In some cases, an inverter (not shown) may optionally be located after trip-point comparator 450 and may be used to invert the output of trip-point comparator 450.

The output voltage of comparator 430 may be applied to an input of switch controller 455. Switch controller 455 may be used to toggle switching components 425-*f* and 425-*g* via switch control line 460. For instance, switch controller 455 may provide two complementary control signals to switching components 425-*f* and 425-*g* based on the output of comparator 430 (e.g., a high control signal to activate switching component 425-*f* and a low control signal to deactivate switching component 425-*g* when an output voltage of comparator 430 is low). Switch controller 455 may then invert the magnitude control signals so that the opposite switching components 425-*f* and 425-*g* are deactivated and activated after the voltage of the comparator changes in response to detecting that the threshold voltage of selection component 215-*a* has been reached. Switch controller 455 may also provide a control signal to signal generator 465, which may direct signal generator 465 to continue to or refrain from decreasing a voltage applied to word line 110-*b*.

Signal generator 465 may be in electronic communication with a first terminal of capacitor 415 and word line 110-*b*. Signal generator 465 may be used to apply a voltage to word line 110-*b* that is used in determining when a threshold voltage of selection component 215-*a* has been reached. In some examples, signal generator 465 may provide a monotonically, linearly, exponentially, or logarithmically decreasing voltage to word line 110-*b* until the threshold voltage of selection component 215-*a* has been reached. At which point, signal generator 465 may maintain the voltage of word line 110-*b* at the current voltage.

Charge accumulator 435 may include a capacitor 440, switching component 425-*d*, and virtual ground 445. In some cases, capacitor 440 may be an intrinsic capacitance. That is, capacitor 440 may not be an electrical device—i.e., may not be a two-terminal capacitor—but instead may represent a capacitance that results from physical characteristics, including the dimensions, of a line or trace, such as digit line 115-*b*. Switching component 425-*d* may be used to connect a terminal of capacitor 440 to supply voltage source 405-*e* and may subsequently be used to isolate capacitor 440 from supply voltage source 405-*e*. After isolating capacitor 440 from supply voltage source 405-*e*, the charge stored across capacitor 440 may be indicative of whether the threshold voltage of selection component 215-*a* has been reached.

Sense component 125-*b* may be used to determine the stored state of ferroelectric memory cell 105-*c*. In some cases, sense component 125-*b* is or includes a sense amplifier. Sense component 125-*b* may be operated by voltage source 405-*a* and voltage source 405-*b*. In some examples, voltage source 405-*a* is a positive supply voltage, while voltage source 405-*b* is a negative supply voltage or a virtual ground. Sense component 125-*b* may be used to determine a logic value of the ferroelectric memory cell 105-*c* based on the voltage of digit line 115-*b* and the voltage of the reference line 470. In some examples, sense component 125-*b* is activated or "fired"—e.g., by a controller—to trigger a comparison between the voltage of digit line 115-*b* and the voltage of reference line 470. A voltage may be applied to reference line 470 to provide a reference for comparing with the voltage of digit line 115-*b*. The voltage of reference line 470 may be used by sense component 125-*b* as a reference for comparison against the voltage of digit line 115-*b*. In some cases, reference line 470 is in electronic communication with a memory cell, that provides a reference voltage when accessed (e.g., during a sensing operation). Sense component 125-*b* may latch the output of a sense amplifier to the voltage provided by either voltage source 405-*a* or voltage source 405-*b*.

Sense component 125-*b* may also be used to write a logic value to ferroelectric memory cell 105-*c*. For instance, during a write operation, sense component 125-*b* may be triggered to apply a voltage that is greater than a voltage applied at word line 110-*b* apply a positive voltage across memory element 220-*a* and to write a logic state 0 to ferroelectric memory cell 105-*c*. In some examples, the voltage applied by sense component 125-*b* is dependent on voltage source 405-*a* and 405-*b*. For instance, voltage source 405-*a* may provide the voltage that is greater than the voltage applied at word line 110-*b*.

Cascode driver 420 may be an input to a cascode amplifier and may be used to fix the voltage of digit line 115-*b* to a desired magnitude. The amplifier may comprises a cascode driver. For example, in some cases, the cascode amplifier includes the cascode driver 420 and the charge accumulator 435.

In some examples, a memory controller may be used to operate circuit 400 to compensate for variations in threshold voltages of selection components, such as selection component 215-*a*. For example, the memory controller may be used to trigger the activation/deactivation of switching components 425 and may also be used to provide the voltages at voltage source 405-*c* through 405-*g*. In some cases, the memory controller may include signal generator 465 and switch controller 455. Memory controller may also be used to trigger sense component 125-*b* and may additionally be used to activate cascode driver 420.

In some cases, the memory controller may also be used to apply a first voltage across a memory cell during a first portion of an access operation, wherein the first voltage increases at first rate until a threshold voltage of the selection component is reached. For instance, memory controller may trigger cascode driver 420 to apply a fixed voltage to digit line 115-*b* and signal generator to apply a linearly decreasing voltage to word line 110-*b*, proportionally increasing the voltage across memory cell 105-*c* over time. Once the threshold voltage has been reached, memory controller may be used to apply a second voltage across the memory cell during a second portion of the access operation when the threshold voltage of the selection component is reached. For instance, memory controller may trigger switch controller 455 to toggle the switch configuration of switching components 425-*f* and 425-*g* and to halt the decrease of the voltage provided by signal generator 465 based on an output voltage of comparator 430.

Figure 4B:
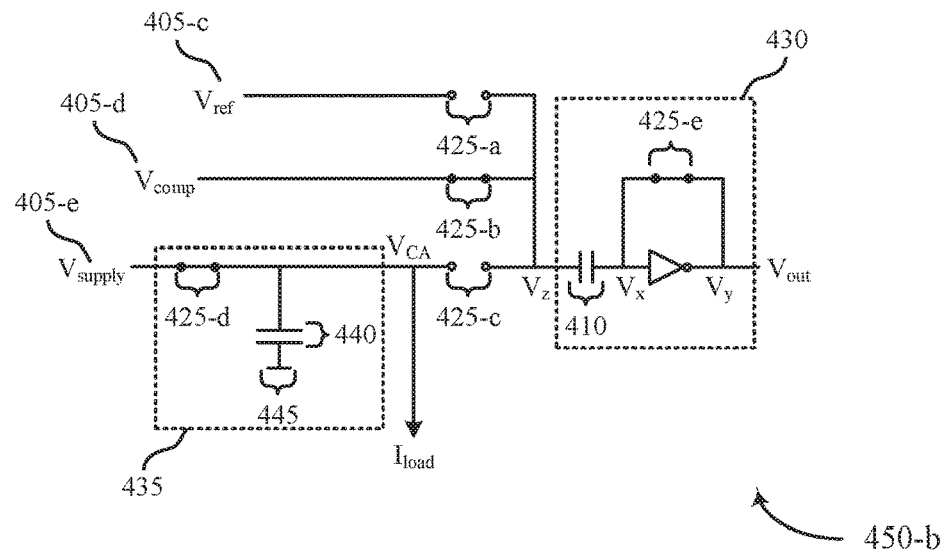

FIG. 4B illustrates an example circuit 450-*b* which includes aspects of circuit 400, as discussed with reference to FIG. 4A, in accordance with various embodiments of the present disclosure. Example circuit 450-*b* includes voltage sources 405-*c* through 405-*e*, switching components 425-*a* through 425-*c*, comparator 430, and charge accumulator 435, as discussed with reference to FIG. 4A. In some cases, circuit 450-*b* may referred to as threshold detection circuit 450-*b*, and may be used for detecting whether the threshold voltage of a selection component has been reached and/or determining the logic state stored by a memory cell.

In some examples, an initialization operation is performed by circuit 450-*b* prior to applying a time-decreasing initial voltage to a memory cell for determining the threshold voltage of a selection component 215-*a*. The initialization process may begin at time $t_1$ with switching components 425-*a* and 425-*c* being deactivated and switching components 425-*b* and 425-*d* being activated. In this configuration, the compensation voltage source 405-*d* is in electronic communication with a first terminal of capacitor 410, which may be denoted as node $V_z$. The compensation voltage may be configured such that $V_{comp}=V_{supply}-V_m$, where $V_m$ may be selected to delay the detection of the threshold voltage being reached. Delaying the detection may reduce the sensitivity of circuit 450-*b* to noise and/or interference. For instance, $V_m$ may be selected based on a slew rate of the voltage applied to word line 110-*b* and a desired detection time (e.g., 1 ns). In some examples, $V_m$ may be selected as 100 mV.

Furthermore, supply voltage source 405-*e* is in electronic communication with a first terminal of capacitor 440 and the output of charge accumulator 435, which may be denoted as node $V_{CA}$. Thus, the capacitor may be charged by supply voltage source 405-*e* to $V_{supply}$. Additionally, the output of comparator 430 may be in electronic communication with the input of comparator 430, connecting nodes $V_x$ and $V_y$. Connecting the input and output of comparator 430 may result in the development of the trip voltage of the comparator 430, $V_{trip}$, at both nodes $V_x$ and $V_y$. Accordingly, the voltage at the input of comparator 430 at time $t_1$ may be represented as:

$$V_{x1}=V_{trip}, \quad (1)$$

the voltage at the first terminal of the capacitor may be represented as:

$$V_{z1}=V_{supply}-V_m, \quad (2)$$

and the voltage across capacitor 410 may be represented as:

$$V_{zx1}=V_{z1}-V_{x1}=(V_{supply}-V_m)-V_{trip}. \quad (3)$$

If the initialization process is associated with determining which logic state is stored by a memory cell, then at time $t'_1$, switching components 425-a and 425-c may be activated while switching components 425-b, 425-d, and 425-e may be deactivated (not shown). Accordingly, the voltage at the input of comparator 430 at time $t'_1$ may be represented as:

$$V_{x1'} = V_{trip}, \quad (4)$$

ant voltage across capacitor 410 at time $t'_1$ may be represented as:

$$V_{zx1'} = V_{ref} - V_{trip} \quad (5)$$

Figure 4C:
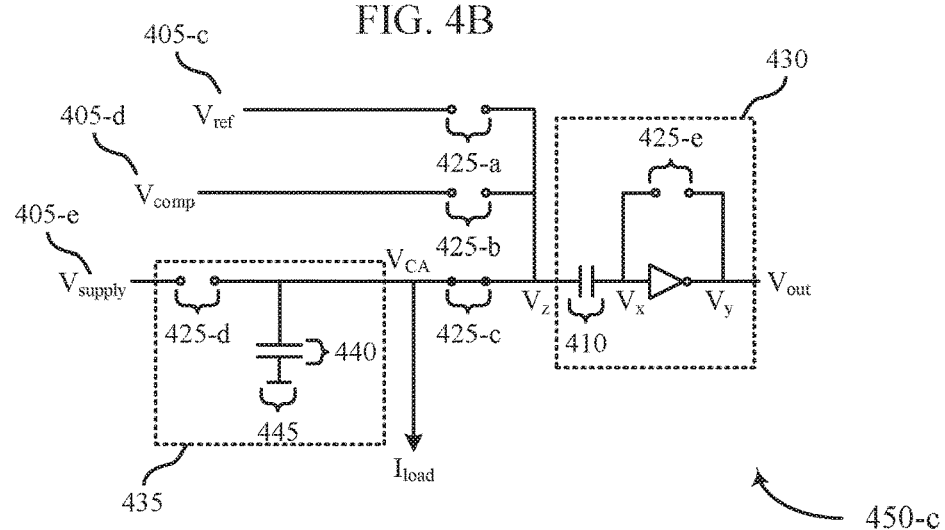

FIG. 4C illustrates an example circuit 450-c which includes aspects of circuit 400, as discussed with reference to FIG. 4A, in accordance with various embodiments of the present disclosure. Example circuit 450-c includes voltage sources 405-c through 405-e, switching components 425-a through 425-c, comparator 430, and charge accumulator 435, as discussed with reference to FIG. 4A. In some cases, circuit 450-c may be used for detecting whether the threshold voltage of a selection component has been reached and/or determining the logic state stored by a memory cell.

In some examples, the initialization process includes deactivating switching components 425-a through 425-d and activating switching component 425-c at time $t_2$. Deactivating switching component 425-d may isolate node $V_{CA}$ from supply voltage source 405-e so that node $V_{CA}$ is electronically floating. And activating switching component 425-c may electronically connect the output of the charge accumulator to node $V_z$ so that the voltage at $V_z$ equals $V_{CA}$. Accordingly, the voltage at the input of comparator 430 at time $t_2$ may be represented as:

$$V_{x2} = V_{CA} - V_{zx1} = V_{supply} - ((V_{supply} - V_m) - V_{trip})$$

$$V_{x2} = V_m + V_{trip}; \quad (6)$$

and the voltage across capacitor 410 may be represented as:

$$V_{zx2} = V_{zx1}. \quad (7)$$

If the initialization process is for determining which logic state is stored by a memory cell, then the voltage at the input of comparator 430 at time $t'_2$ may be represented as:

$$V_{x2'} = V_{CA} - V_{zx1'} = V_{supply} + (V_{trip} - V_{ref}). \quad (8)$$

Therefore, if $V_{ref}$ is greater than $V_{trip}$ than the voltage at the input of comparator 430 will be less than $V_{supply}$ by the amount that $V_{ref}$ is greater than $V_{trip}$.

Figure 4D:
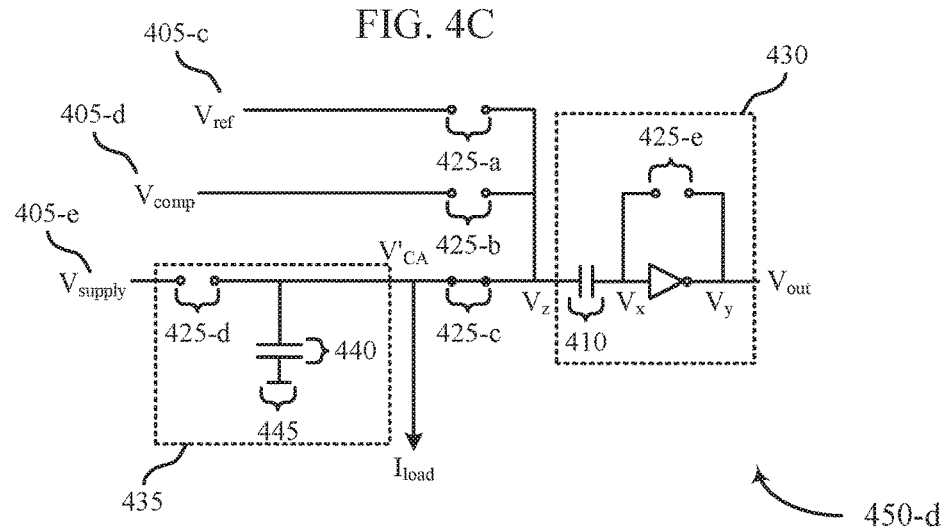

FIG. 4D illustrates an example circuit 450-d which includes aspects of circuit 400, as discussed with reference to FIG. 4A, in accordance with various embodiments of the present disclosure. Example circuit 450-d includes voltage sources 405-c through 405-e, switching components 425-a through 425-c, comparator 430, and charge accumulator 435, as discussed with reference to FIG. 4A. In some cases, circuit 450-d may be used for detecting whether the threshold voltage of a selection component has been reached and/or determining the logic state stored by a memory cell.

At time $t_3$, after initializing the voltage at the input of the comparator $V_x$, the signal generator 465 of FIG. 4A may apply a time-decreasing voltage to the word line 110-b until the threshold voltage of the selection component 215-a is reached. Once the threshold voltage is reached, current may begin to flow through the memory cell 105-c, and as a result, capacitor 440 may discharge as a function of the current. Accordingly, $V_{CA}$ and $V_x$ may also begin to decrease. Therefore, the voltage at the input of comparator 430 at time $t_3$ may be represented as:

$$V_{x3} = V'_{CA} - V_{zx2} = (V_{supply} - \Delta V_{CA}) - (V_{supply} - V_m - V_{trip}) \quad (9)$$

$$V_{x3} = V_{trip} + (V_m - \Delta V_{CA}).$$

As shown by equation 9, when the change in voltage at the output of the charge accumulator 435, $\Delta V_{CA}$, is greater than the selected voltage $V_m$, the voltage at the input of comparator 430, $V_{x3}$ will fall below the trip-point of the comparator. While $V_{x3}$ is greater than the trip-point, the output of comparator 430 may be a first voltage (e.g., a high voltage). After $V_{x3}$ falls below the trip-point voltage, and the output voltage of the comparator may transition to a second, complementary voltage (e.g., a low voltage).

Similarly, for detecting the logic state of the memory cell, the voltage present at the input of comparator 430 at time $t'_3$ may be represented as:

$$V_{x3'} = V_{trip} + V_{supply} - (V_{ref} + \Delta V_{CA}); \quad (10)$$

Accordingly, when $\Delta V_{CA}$ is greater than $V_{supply} - V_{ref}$, the voltage at the input of comparator 430 will fall below the trip-point of the comparator and the output voltage of the comparator will transition to a different voltage. In some examples, $V_{ref}$ may be selected to be between the voltage ($V_{supply} - \Delta V_{CA}$) resulting from sensing a logic state 1, and the voltage ($V_{supply} - \Delta V_{CA}$) resulting from sensing a logic state 0 from a memory cell. In this way, the resulting output of comparator 430 may distinguish between the two logic states during a read operation.

Figure 5A:
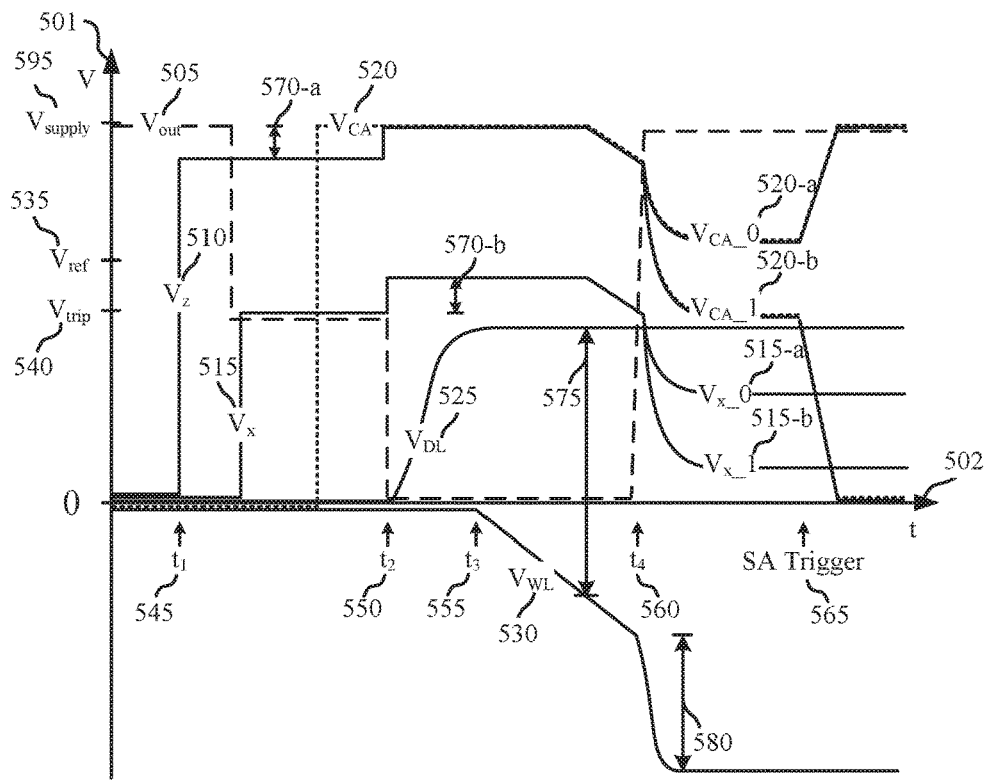
FIGS. 5A and 5B illustrate example timing diagrams illustrating aspects of operation for the example circuit in accordance with various embodiments of the present disclosure.

FIG. 5A shows an example timing diagram 500-a illustrating aspects of operation of the example circuit in accordance with various embodiments of the present disclosure. Timing diagram 500-a depicts voltage on axis 501 and time on axis 502. Thus, voltages resulting from initializing a detection process and from reading or writing to a memory cell, such as first ferroelectric memory cell 105-c, may be represented as a function of time. For example, timing diagram 500-a includes comparator output voltage 505, which may be referred to as $V_{out}$, capacitor voltage 510, which may be referred to as $V_z$, comparator input voltage 515, which may be referred to as $V_x$, charge accumulator voltage 520, which may be referred to as $V_{CA}$, digit line voltage 525, which may be referred to as $V_{DL}$, and word line voltage 530, which may be referred to as $V_{WL}$.

Timing diagram 500-a also includes supply voltage 595, reference voltage 535, trip-point voltage 540, time $t_1$ 545, time $t_2$ 550, time $t_3$ 555, time $t_4$ 560, and trigger time 565. Timing diagram 500-a additionally includes adjustment voltages 570, threshold voltage 575, and capacitor access voltage 580. Timing diagram 500-a depicts an example operation of circuit 400 described with reference to FIGS. 4A-4D. FIG. 5A is described below with reference to components of preceding figures.

In some examples, timing diagram 500-a illustrates an example of initializing circuit 400 using threshold detection circuit 450 and reading memory cell using a sense component separate from threshold detection circuit 450. Voltages that approach zero may be offset from axis 502 for ease of representation; in some cases, these voltages may be equal to or approximately equal to zero. Furthermore, in some cases, the timing of certain signals may be moved forward or backwards in time or may overlap with one another.

As discussed with reference to FIG. 4B, prior to initializing threshold detection circuit 450-b, the comparator output voltage 505 measured at the output of comparator 430 may be high and the voltages measured at the other nodes of circuit 450-b may be low. At time $t_1$ 545 the capacitor voltage 510 at the input of capacitor 410 may increase to the voltage provided by compensation voltage source 405-d (e.g., $V_{supply}-V_m$, where adjustment voltage 570-*a* is equal to $V_m$). Subsequently or concurrently, the input and output of comparator 430 may be connected together and the comparator output voltage 505 and the comparator input voltage may be driven to the trip-point voltage of the comparator. Subsequently or concurrently, the supply voltage source 405-*e* may be connected to charge accumulator 435 and the charge accumulator voltage may rise to the supply voltage.

As discussed with reference to FIG. 4C and at time $t_2$ 550, capacitor voltage 510 may be connected to the output of the charge accumulator 435. Accordingly, the comparator input voltage 515 may rise based on the voltage currently stored across the capacitor 410 (e.g., $V_x=V_{trip}+V_m$, where adjustment voltage 570-*b* is equal to $V_M$). Additionally, the digit line voltage 525 may be driven to a fixed voltage using cascode driver 420. In some examples, the output of comparator 430 may be disconnected from the input prior to capacitor voltage 510 being connected and the comparator output voltage 505 may be driven low.

As discussed with reference to FIG. 4D and at time $t_3$ 555, the signal generator 465 may apply a time-decreasing voltage to word line 110-*b* and word line voltage 530 may decrease. Once the voltage difference between digit line 115-*b* and word line 110-*b* is greater than or equal to the threshold voltage 575 of selection component 215-*a*, charge may begin to flow through memory cell 105-*c*. The charge may be provided by capacitor 440 of charge accumulator 435. Since the output of the charge accumulator 435 is currently floating, the charge accumulator voltage 520 and the comparator input voltage 515 may begin decreasing. Once the change in the charge accumulator voltage 520 is greater than the adjustment voltage 570, the comparator input voltage 515 may fall below the trip-point of comparator 430 and the comparator output voltage 505 may rise to a high voltage. In some cases, the comparator output voltage 505 may be used to determine that selection component 215-*a* has been activated (i.e., identify that the threshold voltage of selection component 215-*a* has been reached).

After identifying that the threshold voltage has been reached and at time $t_4$ 560, capacitor access voltage 580 may be applied to word line 110-*b*. In some examples, capacitor access voltage 580 may be applied by deactivating switching component 425-*f* and activating switching component 425-*g*. Since the actual threshold voltage of selection component 215-*a* has been reached, most or all of capacitor access voltage 580 will be applied directly across memory element 220-*a*. Based on the logic stated stored by memory cell 105-*c*, the charge accumulator voltage 520 will decrease by a certain magnitude. For example, if a logic state 0 is stored, then charge accumulator voltage 520-*a* may develop. Or if a logic state 1 is stored, then charge accumulator voltage 520-*b* may develop. Similarly, comparator input voltages 515-*a* and 515-*b* may develop.

At trigger time 565, sense component 125-*b* may be fired and the charge accumulator voltage 520 may be compared against reference voltage 535. Reference voltage 535 may be selected to be the average of resulting charge accumulator voltages 520-*a* and 520-*b* and may be provided to sense component 125-*b* via reference line 470. Thus, if memory cell 105-*c* is storing a logic state 0, the output of sense component 125-*b* may be a high voltage. Or if the memory cell 105-*c* is storing a low voltage, the output of sense component 125-*b* may be a low voltage. In either case, the output voltage of sense component 125-*b* may be latched and read by a memory controller to determine the stored logic state.

In some examples, the sensed logic state may be written back to the memory cell 105-*c*. The polarity of the write-back voltage induced across the memory cell 105-*c* may be dependent on the sense logic state. For instance, if the sensed logic state is a logic 1, the polarity of the voltage applied across the memory cell 105-*c* to write a logic 1 may be negative. Conversely, if the sensed logic state is a logic 0, the polarity of the voltage applied across the memory cell 105-*c* may be positive. In some examples, aspects of the process described above may be used to write a logic 1 to the memory cell 105-*c*, however, the polarities of the digit line 115-*b* and the word line 110-*b*, may be reversed. That is, to develop the negative voltage across the memory cell 105-*c*, the voltage of the word line 110-*b* may be increased until a reverse breakdown threshold voltage of selection component 215-*a* is reached. And a subsequent capacitor voltage with a negative polarity may be applied to digit line 115-*b*, thus, the capacitor voltage with negative polarity may be applied across ferroelectric capacitor 220-*a*.

Figure 5B:
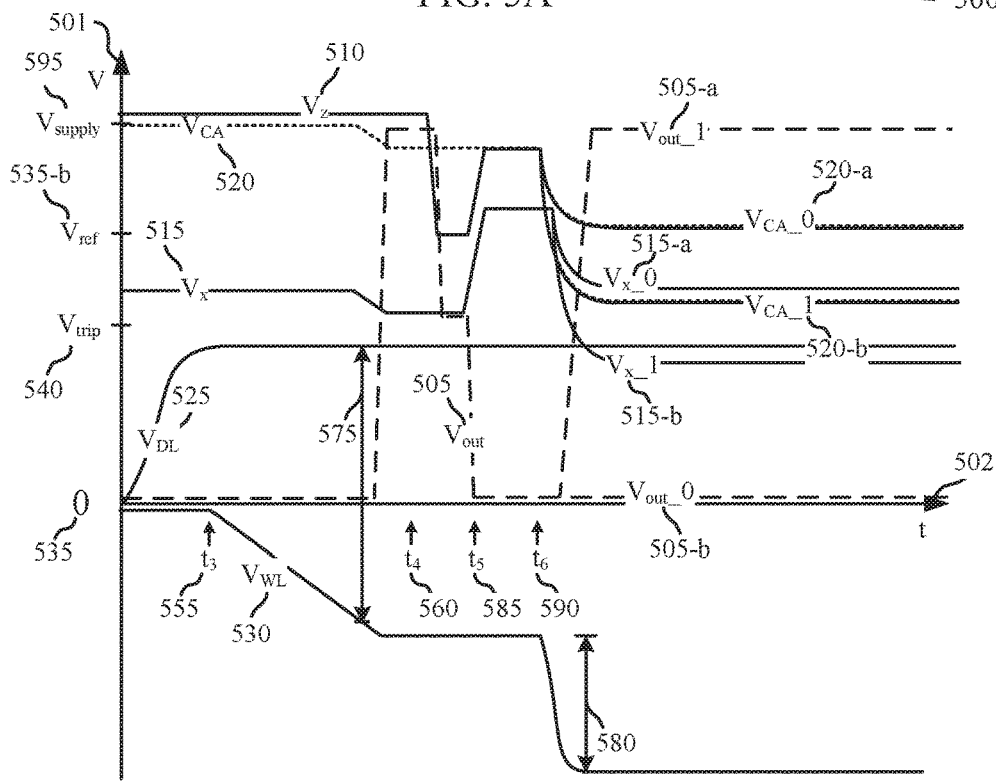

FIG. 5B shows an example timing diagram 500-*b* illustrating aspects of operation of the example circuit in accordance with various embodiments of the present disclosure. Timing diagram 500-*b* depicts voltage on axis 501 and time on axis 502. Thus, voltages resulting from initializing a detection process and from reading or writing to a memory cell, such as first ferroelectric memory cell 105-*c*, may be represented as a function of time. For example, timing diagram 500-*b* includes comparator output voltage 505, which may be referred to as $V_{out}$, capacitor voltage 510, which may be referred to as $V_z$, comparator input voltage 515, which may be referred to as $V_x$, charge accumulator voltage 520, which may be referred to as $V_{CA}$, digit line voltage 525, which may be referred to as $V_{DL}$, and word line voltage 530, which may be referred to as $V_{WL}$.

Timing diagram 500-*b* also includes supply voltage 595, reference voltage 535-*b*, trip-point voltage 540, time $t_3$ 555, time $t_4$ 560, and time $t_5$ 585. Timing diagram 500-*b* additionally includes adjustment voltages 570, threshold voltage 575, and capacitor access voltage 580. Timing diagram 500-*b* depicts an example operation of circuit 400 described with reference to FIGS. 4A-4D. FIG. 5A is described below with reference to components of preceding figures.

In some examples, timing diagram 500-*b* illustrates an example of initializing circuit 400 using threshold detection circuit 450 and re-initializing the threshold detection circuit 450 to read the memory cell. Voltages that approach zero may be offset from axis 502 for ease of representation; in some cases, these voltages may be equal to or approximately equal to zero. Furthermore, in some cases, the timing of certain signals may be moved forward or backwards in time or may overlap with one another.

As discussed with reference to FIG. 5A and prior to time $t_3$ 555, comparator input voltage 515 may equal $V_{trip}+V_m$. Additionally, the digit line voltage 525 may be driven to a fixed voltage and the comparator output voltage 505 may be low. At time $t_3$ 555, word line voltage 530 may begin to decrease over time—e.g., by applying a time-decreasing voltage to word line 110-*b* via signal generator 465. At a later point in time, threshold voltage 575 of selection component 215-*a* may be reached and current may begin to flow through memory cell 105-*c*.

At time $t_4$ 560, comparator input voltage 515 may fall below trip-point voltage 540 and comparator output voltage 505 may increase to a high voltage. However, instead of immediately triggering the application of capacitor access voltage 580, circuit 450 may perform a re-initialization process. For example, as discussed with reference to FIG.

4B, reference voltage source 405-*c* may apply a reference voltage to capacitor 410 and capacitor voltage 510 may be driven to $V_{ref}$. Concurrently, the input and output of comparator 430 may be connected together and the comparator input voltage 515 and the comparator output voltage 505 may be driven to $V_{trip}$.

As discussed with reference to FIG. 4C, at time $t_5$ 585 the output of the charge accumulator 435 may be connected to capacitor 410 and capacitor voltage 510 may rise to equal the charge accumulator voltage 520. As a result, comparator input voltage 515 may similarly rise so that $V_x = V_{supply} - (V_{ref} - V_{trip})$ and comparator output voltage 505 may be driven low.

As discussed with reference to FIG. 4D, at time $t_6$ 590 capacitor access voltage 580 may be applied to word line 110-*b*. Accordingly, the charge accumulator voltage 520 will decrease by a magnitude based on the logic stated stored by memory cell 105-*c*, as discussed with reference to FIG. 5A. The comparator may then be used to determine whether the stored logic state is a logic 1 or a logic 0. For example, if memory cell 105-*c* is storing a logic state 0, then the resulting charge accumulator voltage 520-*a* may be greater than trip-point voltage 540 and comparator output voltage 505-*b* may remain low. Otherwise, if memory cell 105-*c* is storing a logic state 1, then the resulting charge accumulator voltage 520-*b* may be less than trip-point voltage 540 and comparator output voltage 505-*a* may be driven high. Accordingly, a high comparator output voltage 505-*a* may be associated with a logic state 1 and a low comparator output voltage 505-*b* may be associated with a logic state 0. In this way, comparator 430 may be used to read a logic state from memory cell 105-*c* and sense component 125-*b* may optionally be excluded from circuit 400.

Figure 6:
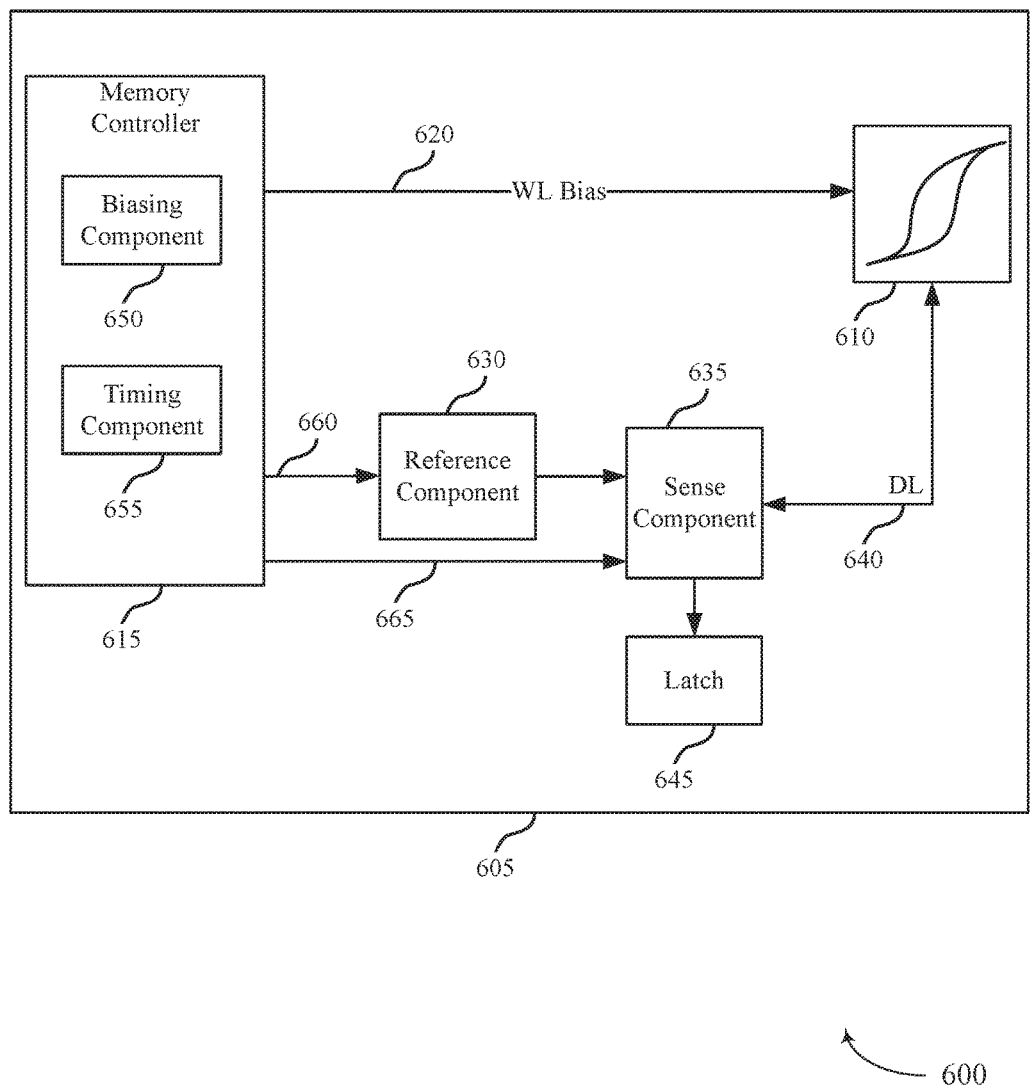
FIGS. 6 and 7 show block diagrams of a device that supports compensating for variations in threshold voltages of selection components in accordance with various embodiments of the present disclosure.

FIG. 6 shows a block diagram 600 of a device 605 that supports compensating for variations in threshold voltages of selection components in accordance with various embodiments of the present disclosure. Device 605 may be referred to as an electronic memory apparatus, and may be an example of a component of a memory array 100 as described with reference to FIG. 1.

Device 605 may include one or more memory cells 610, a memory controller 615, a word line 620, a reference component 630, a sense component 635, a digit line 640, and a latch 645. These components may be in electronic communication with each other and may perform one or more of the functions described herein. In some cases, memory controller 615 may include biasing component 650 and timing component 655. Memory controller 615 may be an example of aspects of the memory controller 715 and memory controller 815 described with reference to FIGS. 7 and 8.

Memory controller 615 may be in electronic communication with word line 620, digit line 640, and sense component 635 which may be examples of word line 110, digit line 115, and sense component 125 described with reference to FIGS. 1, and 2. Device 605 may also include reference component 630 and latch 645. The components of device 605 may be in electronic communication with each other and may perform aspects of the functions described with reference to FIGS. 1 through 5B. In some cases, reference component 630, sense component 635, and latch 645 may be components of memory controller 615.

In some examples, digit line 640 is in electronic communication with sense component 635 and a ferroelectric capacitor of ferroelectric memory cells 610. A ferroelectric memory cell 610 may be writable with a logic state (e.g., a first or second logic state). Word line 620 may be in electronic communication with memory controller 615 and a selection component of ferroelectric memory cell 610. Sense component 635 may be in electronic communication with memory controller 615, digit line 640, latch 645, and reference line 660. Reference component 630 may be in electronic communication with memory controller 615 and reference line 660. Sense control line 665 may be in electronic communication with sense component 635 and memory controller 615. These components may also be in electronic communication with other components, both inside and outside of device 605, in addition to components not listed above, via other components, connections, or busses.

Memory controller 615 may be configured to activate word line 620 or digit line 640 by applying voltages to those various nodes. For example, biasing component 650 may be configured to apply a voltage to operate memory cell 610 to read or write memory cell 610 as described above. In some cases, memory controller 615 may include a row decoder, column decoder, or both, as described with reference to FIG. 1. This may enable memory controller 615 to access one or more memory cells 105. Biasing component 650 may also provide voltage potentials to reference component 630 in order to generate a reference signal for sense component 635. Additionally, biasing component 650 may provide voltage potentials for the operation of sense component 635.

In some cases, memory controller 615 may perform its operations using timing component 655. For example, timing component 655 may control the timing of the various word line selections or plate biasing, including timing for switching and voltage application to perform the memory functions, such as reading and writing, discussed herein. In some cases, timing component 655 may control the operations of biasing component 650.

Reference component 630 may include various components to generate a reference signal for sense component 635. Reference component 630 may include circuitry configured to produce a reference signal. In some cases, reference component 630 may be implemented using other ferroelectric memory cells 105. Sense component 635 may compare a signal from memory cell 610 (through digit line 640 or at the output of charge accumulator 435) with a reference signal from reference component 630. Upon determining the logic state, the sense component may then store the output in latch 645, where it may be used in accordance with the operations of an electronic device that device 605 is a part. Sense component 635 may include a sense amplifier in electronic communication with the latch and the ferroelectric memory cell.

Memory controller 615, in combination with other components of device 605, may apply a first voltage across a memory cell during a first portion of an access operation, where the first voltage increases at first rate until a threshold voltage of the selection component is reached. Memory controller 615 may also apply a second voltage across the memory cell during a second portion of the access operation when the threshold voltage of the selection component is reached. In some cases, the second voltage increases at a second rate that is different than the first rate. In some cases, the memory controller 615 may apply a time-varying voltage across a memory cell for an access operation, determine that a threshold voltage of a selection component of the memory cell is reached based on a magnitude of the time-varying voltage, and apply another voltage across the memory cell based on the determination that the threshold voltage for the selection component is reached. The other voltage may be an access voltage, which may be equivalent to the addition of an activation voltage and capacitor voltage, as discussed above.

Figure 7:
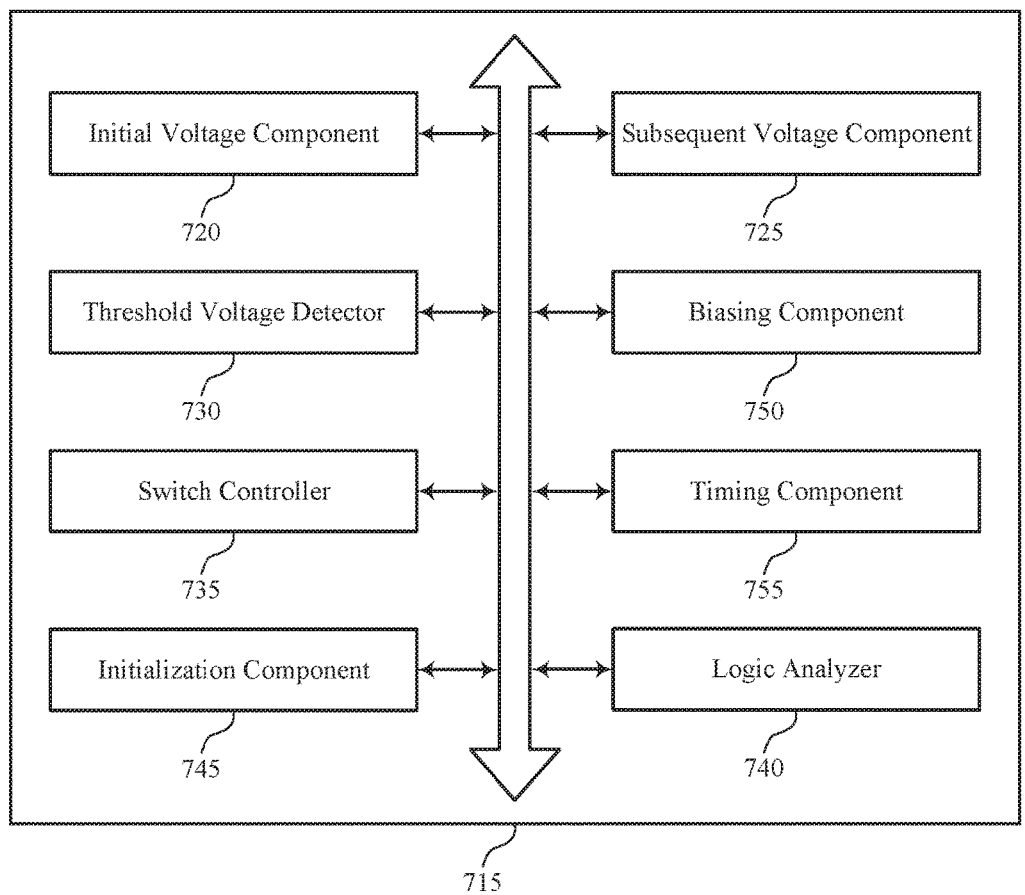

FIG. 7 shows a block diagram 700 of a memory controller 715 that supports compensating for variations in threshold voltages of selection components in accordance with various embodiments of the present disclosure. The memory controller 715 may be an example of memory controller 615 or memory controller 815 as described with reference to FIGS. 6 and 8. The memory controller 715 may include initial voltage component 720, subsequent voltage component 725, threshold voltage detector 730, switch controller 735, logic analyzer 740, initialization component 745, biasing component 750, and timing component 755. Biasing component 750 and timing component 755 may be examples of biasing component 650 and timing component 655 as discussed with reference to FIG. 6. Each of these modules may communicate, directly or indirectly, with one another (e.g., via one or more buses).

Initial voltage component 720, in combination with other components of device 605, may apply a first voltage (e.g., by triggering a signal generator to apply a time-decreasing voltage to a word line) across a memory cell during a first portion of an access operation. The first voltage may increase at first rate until a threshold voltage of the selection component is reached (e.g., an activation voltage). Applying the first voltage across the memory cell may include maintaining a digit line (e.g., by activating a cascode driver) that is in electronic communication with the memory cell at a constant voltage. In some cases, the first voltage may be applied as a time-varying voltage across a memory cell for an access operation. For instance, the first voltage may be applied as a time-decreasing voltage (e.g., linearly, exponentially, logarithmically, etc.) to a word line that is in electronic communication with the memory cell until the threshold voltage is reached.

Subsequent voltage component 725 may, in combination with other components of device 605, apply a second voltage, or an access voltage, (e.g., by triggering complementary switches, such as switching components 425-f and 425f, to toggle) across the memory cell and the selection component during a second portion of the access operation when the threshold voltage of the selection component is reached. In some cases, the increase from the first voltage to the second voltage may increase at a second rate that is different than the first rate. The first voltage may increase to the second voltage at a different rate than the first rate. In some cases, a first terminal of a capacitor is in electronic communication with a word line, that is in electronic communication with a selection component, and a second terminal of the capacitor is in electronic communication with a set of voltage sources. Applying the second voltage may include increasing the voltage applied across the capacitor from a first voltage at a magnitude associated with the threshold voltage being reached to a second voltage associated with accessing the memory cell. In some examples, subsequent voltage component 725 maintains the first voltage by directing signal generator 465 to stop decreasing a time-varying voltage and to hold the output voltage at the present voltage. In some cases, subsequent voltage component 725 applies the second voltage to the memory cell based on a determination that the threshold voltage for the selection component is reached. In some cases, the second voltage is applied based on the output voltage of the charge accumulator reaching a threshold and a resulting output voltage of the comparator being applied to the switch controller. In some cases, the other voltage is applied after initializing a second sensing operation.

Threshold voltage detector 730 may determine that the threshold voltage of the selection component is reached based on detecting current flow through the memory cell (e.g., based on a voltage of a charge accumulator), and the second voltage may be applied by subsequent voltage component 725 based on the determining. In some examples, threshold voltage detector 730 may be implemented external to the memory controller 715 as a comparator, and may apply an output voltage of the comparator to a switch controller 735 based on the output voltage of the charge accumulator. In some cases, determining the threshold voltage is reached includes determining that a third voltage that is indicative of the current flow through the memory cell (e.g., the output voltage of the charge accumulator) has reached or exceeded a threshold value. In some cases, a value of the detected current flow is greater or equal to 1 µA. In some cases, the determination that the threshold voltage of the selection component of the memory cell is reached is based on an output voltage of a comparator that is in electronic communication with the selection component, where a trip-point of the comparator is based on the threshold voltage of the selection component.

Switch controller 735, in combination with other components of device 605, may isolate a first voltage source (e.g., by deactivating a switching component) of the set of voltage sources from the second terminal of the capacitor based on the threshold voltage being reached and couple a second voltage source (e.g., by activating a switching component) of the set of voltage sources to the second terminal of the capacitor based on the threshold voltage being reached. The switch controller 735 may provide one or more control signals to at least one of: a signal generator, a set of switches that are in electronic communication with a third voltage source and a fourth voltage source, or both, and determine that a threshold voltage of a selection component of the memory cell is reached based on a magnitude of the time-varying voltage. In some cases, a switch controller 735 is in electronic communication with the signal generator, the first switching component, and the second switching component. Logic analyzer 740 may read a logic state stored by the memory cell after applying the second voltage.

Initialization component 745, in combination with other components of device 605, may be used to initialize (e.g., by toggling a set of switches implemented about a comparator) a sensing operation (e.g., a threshold detection operation or a logic state determination operation). In some cases, a capacitor is located between a set of voltage sources and the comparator and initialization component 745 may (1) connect a first voltage source to a first terminal of a capacitor that is in electronic communication with a comparator and a charge accumulator, (2) connect an output of the comparator to a second terminal of the capacitor, the second terminal being in electronic communication with an input of the comparator, (3) isolate the second terminal from the output of the comparator, and (4) isolate the first terminal from the first voltage source. Initialization component 745 may also isolate the charge accumulator that is in electronic communication with a second voltage source and the first terminal of the capacitor from the second voltage source, and connect an output of the charge accumulator to the first terminal of the capacitor after isolating the first voltage source, where an output voltage of the charge accumulator is indicative of an amount of current flow through the memory cell.

In some cases, initialization component 745 may initialize a second sensing operation based on the output voltage of the charge accumulator reaching a threshold and a resulting output voltage of the comparator being applied to a switch controller, where initializing the second sensing operation includes (1) isolating the output of the charge accumulator from the first terminal of the capacitor, (2) connect a third voltage source to the first terminal of the capacitor, where the third voltage source is associated with a reference voltage for reading the memory cell, (3) connect the output of the comparator to the second terminal of the capacitor, (4) isolate the second terminal from the output of the comparator, (5) isolate the third voltage source from the first terminal, and (6) re-connect the output of the charge accumulator to the first terminal.

Figure 8:
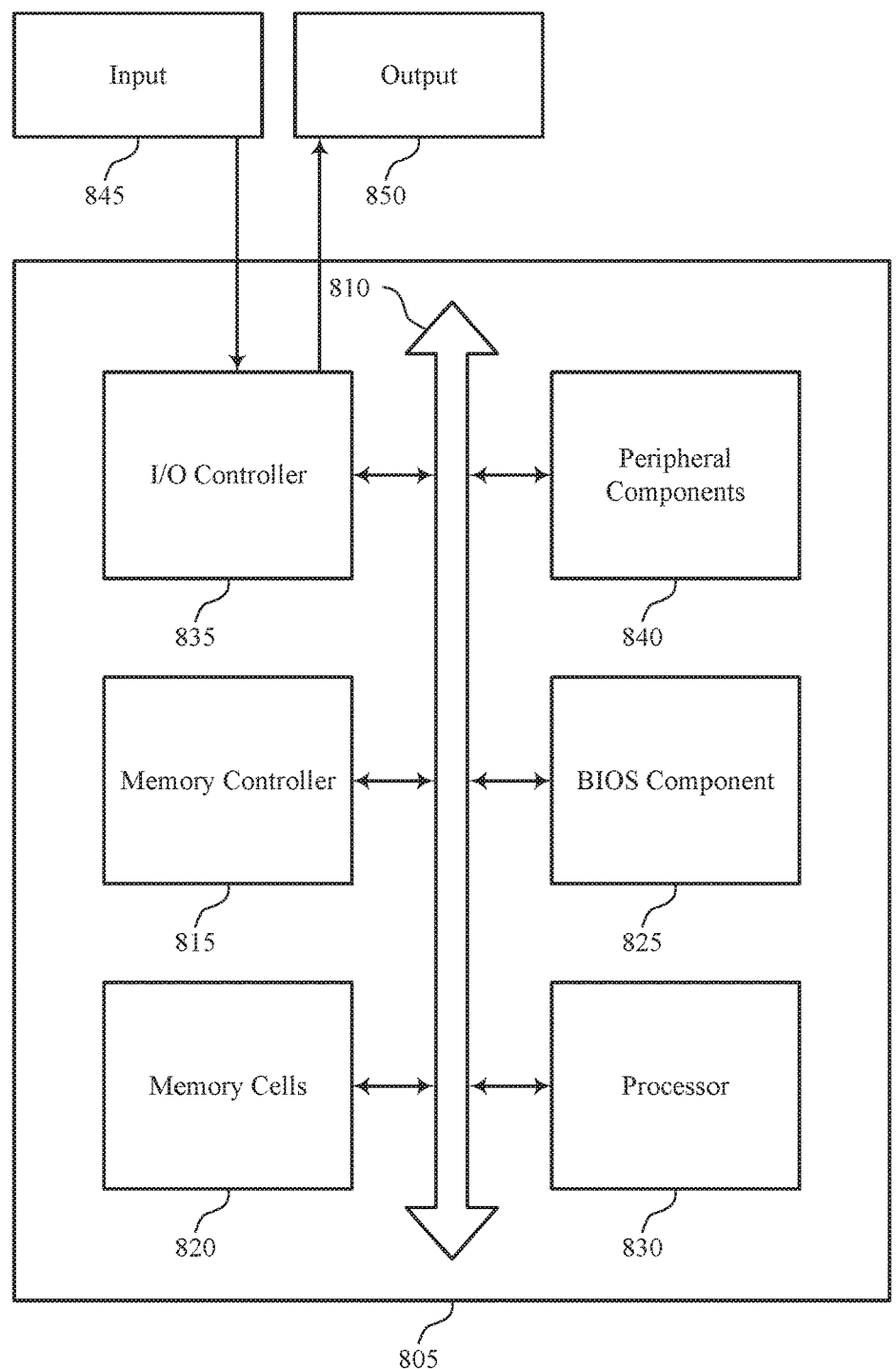
FIG. 8 illustrates a block diagram of a system including a memory array that supports compensating for variations in threshold voltages of selection components in accordance with various embodiments of the present disclosure.

FIG. 8 shows a diagram of a system 800 including a device 805 that supports compensating for variations in threshold voltages of selection components in accordance with various embodiments of the present disclosure. Device 805 may be an example of or include the components of memory array 100 as described above, e.g., with reference to FIG. 1. Device 805 may include components for bi-directional voice and data communications including components for transmitting and receiving communications, including memory controller 815, memory cells 820, BIOS component 825, processor 830, I/O controller 835, and peripheral components 840.

Memory controller 815 may operate one or more memory cells as described herein. Specifically, memory controller 815 may be configured to support compensating for variations in threshold voltages of selection components. In some cases, memory controller 815 may include a row decoder, column decoder, or both, as described with reference to FIG. 1 (not shown). Memory cells 820 may store information (i.e., in the form of a logical state) as described herein.

BIOS component 825 may be a software component that includes a basic input/output system (BIOS) operated as firmware, which may initialize and run various hardware components. BIOS component 825 may also manage data flow between a processor and various other components, e.g., peripheral components, input/output control component, etc. BIOS component 825 may include a program or software stored in read-only memory (ROM), flash memory, or any other non-volatile memory.

Processor 830 may include an intelligent hardware device, (e.g., a general-purpose processor, a digital signal processor (DSP), a central processing unit (CPU), a microcontroller, an application specific integrated circuit (ASIC), a field-programmable gate array (FPGA), a programmable logic device, a discrete gate or transistor logic component, a discrete hardware component, or any combination thereof). In some cases, processor 830 may be configured to operate a memory array using a memory controller. In other cases, a memory controller may be integrated into processor 830. Processor 830 may be configured to execute computer-readable instructions stored in a memory to perform various functions (e.g., functions or tasks supporting compensating for variations in threshold voltages of selection components).

I/O controller 835 may manage input and output signals for device 805. I/O controller 835 may also manage peripherals not integrated into device 805. In some cases, I/O controller 835 may represent a physical connection or port to an external peripheral. In some cases, I/O controller 835 may utilize an operating system such as iOS®, ANDROID®, MS-DOS®, MS-WINDOWS®, OS/2®, UNIX®, LINUX®, or another known operating system.

Peripheral components 840 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Figure 9:
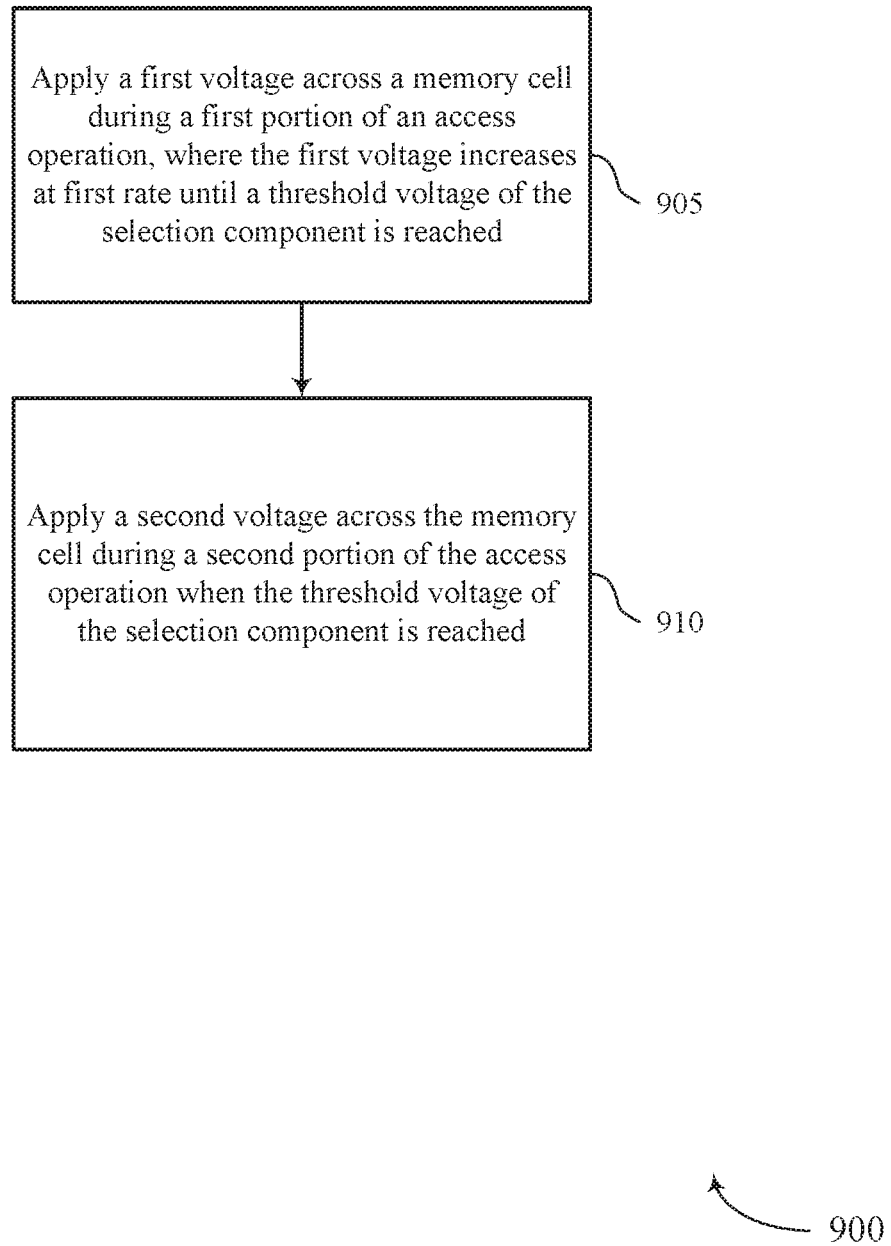
FIGS. 9 and 10 are flowcharts that illustrate a method or methods for compensating for variations in threshold voltages of selection components in accordance with various embodiments of the present disclosure.

FIG. 9 shows a flowchart illustrating a method 900 for compensating for variations in threshold voltages of selection components in accordance with various embodiments of the present disclosure. The operations of method 900 may be implemented by a memory array 100 or its components as described herein. For example, the operations of method 900 may be performed by a memory controller as described with reference to FIGS. 6 through 8. In some examples, a memory array 100 may execute a set of codes to control the functional elements of the device to perform the functions described below. Additionally or alternatively, the memory array 100 may perform aspects of the functions described below using special-purpose hardware.

At block 905 the memory array 100 may apply a first voltage across a memory cell that includes a selection component during a first portion of an access operation, wherein the first voltage increases at first rate until a threshold voltage of the selection component is reached. The operations of block 905 may be performed according to the methods described with reference to FIGS. 1 through 5B. In certain examples, aspects of the operations of block 905 may be performed by an initial voltage component as described with reference to FIGS. 6 through 8. In some cases, the applying the first voltage across the memory cell comprises maintaining a digit line that is in electronic communication with the memory cell at a constant voltage, while applying a linearly decreasing voltage to a word line that is in electronic communication with the memory cell until the threshold voltage is reached.

In some cases, the method may also include determining that the threshold voltage of the selection component is reached based at least in part on detecting current flow through the memory cell, wherein the second voltage is applied based at least in part on the determining. In some cases, the determining the threshold voltage is reached comprises determining that a third voltage that is indicative of the current flow through the memory cell has reached or exceeded a threshold value. In some cases, a value of the detected current flow is greater or equal to 1 µA.

At block 910 the memory array 100 may apply a second voltage across the memory cell during a second portion of the access operation when the threshold voltage of the selection component is reached. The operations of block 910 may be performed according to the methods described with reference to FIGS. 1 through 5B. In certain examples, aspects of the operations of block 910 may be performed by a subsequent voltage component as described with reference to FIGS. 6 through 8. In some cases, the second voltage increases at a second rate that is different than the first rate.

In some cases, a first terminal of a capacitor is in electronic communication with the word line and a second terminal of the capacitor is in electronic communication with a plurality of voltage sources, and applying the second voltage comprises maintaining the first voltage applied to the word line at a magnitude associated with reaching the threshold voltage, and isolating a first voltage source of the plurality of voltage sources from the second terminal of the capacitor based at least in part on the threshold voltage being reached. In some cases, the method may also include coupling a second voltage source of the plurality of voltage sources to the second terminal of the capacitor based at least in part on the threshold voltage being reached. In some cases, the method may also include reading a logic state stored by the memory cell after applying the second voltage.

Figure 10:
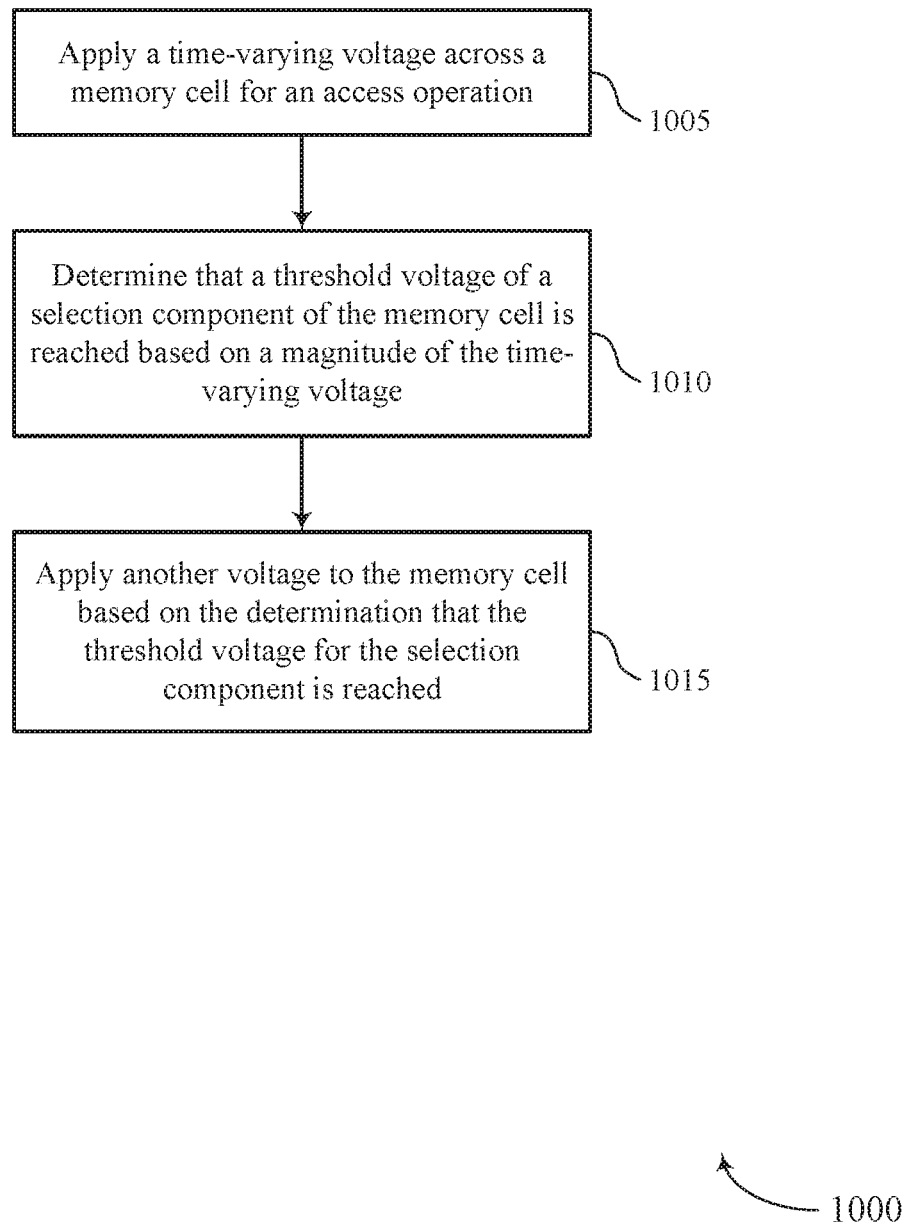

FIG. 10 shows a flowchart illustrating a method 1000 for compensating for variations in threshold voltages of selection components in accordance with various embodiments of the present disclosure. The operations of method 1000 may be implemented by a memory array 100 or its components as described herein. For example, the operations of method 1000 may be performed by a memory controller as described with reference to FIGS. 6 through 8. In some examples, a memory array 100 may execute a set of codes to control the functional elements of the device to perform the functions described below. Additionally or alternatively, the memory array 100 may perform aspects the functions described below using special-purpose hardware.

In some cases, a capacitor is located between a plurality of voltage sources and a comparator, and the method 1000 begins with initializing a sensing operation. Initializing the sensing operation may include (1) connecting a first voltage source to a first terminal of the capacitor, (2) connecting an output of the comparator to a second terminal of the capacitor, the second terminal being in electronic communication with an input of the comparator, (3) isolating the second terminal from the output of the comparator, and (4) isolating the first terminal from the first voltage source. In some cases, the method may also include isolating a charge accumulator that is in electronic communication with a second voltage source and the first terminal of the capacitor from the second voltage source and connecting an output of the charge accumulator to the first terminal of the capacitor after isolating the first voltage source, wherein an output voltage of the charge accumulator is indicative of an amount of current flow through the memory cell.

At block 1005 the memory array 100 may apply a time-varying voltage across a memory cell for an access operation. The operations of block 1005 may be performed according to the methods described with reference to FIGS. 1 through 5B. In certain examples, aspects of the operations of block 1005 may be performed by an initial voltage component as described with reference to FIGS. 6 through 8.

At block 1010 the memory array 100 may determine that a threshold voltage of a selection component of the memory cell is reached based at least in part on a magnitude of the time-varying voltage. The operations of block 1010 may be performed according to the methods described with reference to FIGS. 1 through 5B. In certain examples, aspects of the operations of block 1010 may be performed by a threshold voltage detector as described with reference to FIGS. 6 through 8. In some cases, the method may also include applying an output voltage of the comparator to a switch controller based at least in part on the output voltage of the charge accumulator, wherein the switch controller provides one or more control signals to at least one of: a signal generator, a plurality of switches that are in electronic communication with a third voltage source and a fourth voltage source, or both. In some cases, the determination that the threshold voltage of the selection component of the memory cell is reached is based at least in part on an output voltage of a comparator that is in electronic communication with the selection component, wherein a trip-point of the comparator is based at least in part on the threshold voltage of the selection component.

At block 1015 the memory array 100 may apply another voltage to the memory cell based at least in part on the determination that the threshold voltage for the selection component is reached. The other voltage may be referred to as the access voltage and may be equivalent to the addition of an activation voltage and a capacitor voltage. The operations of block 1015 may be performed according to the methods described with reference to FIGS. 1 through 5B. In certain examples, aspects of the operations of block 1015 may be performed by a subsequent voltage component as described with reference to FIGS. 6 through 8. In some cases, the other voltage is applied based at least in part on the output voltage of the charge accumulator reaching a threshold and a resulting output voltage of the comparator being applied to the switch controller.

In some cases, the method may include initializing a second sensing operation based at least in part on the output voltage of the charge accumulator reaching a threshold and a resulting output voltage of the comparator being applied to a switch controller, wherein initializing the second sensing operation comprises (1) isolating the output of the charge accumulator from the first terminal of the capacitor, (2) connecting a third voltage source to the first terminal of the capacitor, wherein the third voltage source is associated with a reference voltage for reading the memory cell, (3) connecting the output of the comparator to the second terminal of the capacitor, (4) isolating the second terminal from the output of the comparator (5) isolating the third voltage source from the first terminal, and (6) re-connecting the output of the charge accumulator to the first terminal. In some cases, the other voltage is applied after initializing the second sensing operation.

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   indicating, by a comparator that is in electronic communication with a memory cell, that a threshold voltage of the memory cell has been reached;
   sensing, by the comparator, a logic state stored by the memory cell based at least in part on the threshold voltage being reached.

2. The method of claim 1, the method further comprising:
   initializing, by the comparator, a sensing operation based at least in part on the indicating, wherein sensing the logic state stored by the memory cell is based at least in part on the sensing operation.

3. The method of claim 2, wherein initializing the sensing operation comprises:
   programming, based at least in part on a trip-point of the comparator and a reference voltage for reading the memory cell, a first voltage at an input of the comparator.

4. The method of claim 3, wherein programming the first voltage at the input of the comparator comprises:
   isolating a charge accumulator in electronic communication with the comparator from a capacitor in electronic communication with the comparator;
   connecting a voltage source in electronic communication with the comparator to the capacitor, the voltage source associated with the reference voltage for reading the memory cell;
   isolating the comparator and the voltage source from the capacitor; and
   reconnecting the charge accumulator to the capacitor.

5. The method of claim 3, further comprising:
   generating a second voltage at the input of the comparator in response to applying a third voltage to the memory cell based at least in part on the indicating.

6. The method of claim 5, wherein the second voltage is below the trip-point of the comparator, and wherein an output of the comparator increases to a fourth voltage corresponding to a first logic state based at least in part on applying the third voltage.

7. The method of claim 1, further comprising:
   programming, based at least in part on the threshold voltage of the memory cell, a first voltage at an input of the comparator.

8. The method of claim 7, further comprising:
   generating a second voltage at the input of the comparator by applying a third voltage to the memory cell, wherein indicating that the threshold voltage of the memory cell has been reached is based at least in part on the second voltage;
   applying a fourth voltage to the memory cell based at least in part on the indicating.

9. The method of claim 7, wherein indicating that the threshold voltage of the memory cell has been reached comprises:
   outputting a second voltage when a third voltage at the input of the comparator is below a trip-point of the comparator.

10. An apparatus, comprising:
    a charge accumulator in electronic communication with a memory cell, the charge accumulator configured to detect current flow through the memory cell;
    a comparator in electronic communication with the memory cell and the charge accumulator, the comparator configured to indicate that a threshold voltage of the memory cell has been reached based at least in part on an output of the charge accumulator;
    a switch controller in electronic communication with the comparator, the switch controller configured to apply a second voltage to the memory cell based at least in part on an indication from the comparator; and
    a signal generator in electronic communication with the memory cell and the switch controller, the signal generator configured to apply a first voltage to the memory cell based at least in part on an output of the switch controller.

11. The apparatus of claim 10, further comprising:
    a sense component in electronic communication with the memory cell, the sense component configured to sense a logic state stored at the memory cell based at least in part on the second voltage being applied to the memory cell.

12. The apparatus of claim 10, further comprising:
    a first switching component and a second switching component in electronic communication with the switch controller, the switch controller configured to activate the first switching component and deactivate the second switching component based at least in part on the indication from the comparator.

13. The apparatus of claim 10, further comprising:
    a plurality of voltage sources in electronic communication with the comparator, the plurality of voltage sources configured to program a voltage at an input of the comparator.

14. The apparatus of claim 13, further comprising:
    a capacitor in electronic communication with the plurality of voltage sources and the comparator, wherein the voltage at the input of the comparator is based at least in part on a voltage of the charge accumulator and a voltage stored by the capacitor; and
    a plurality of switching components in electronic communication with the plurality of voltage sources and the comparator; the plurality of switching components configured to program the voltage at the input of the comparator.

15. The apparatus of claim 13, further comprising:
    a cascode driver in electronic communication with the memory cell and an access line, wherein the input of the comparator is in electronic communication with the access line, and wherein the cascode driver is configured to set a voltage of the access line.

16. The apparatus of claim 10, wherein the comparator is further configured to sense a logic state stored at the memory cell based at least in part on the second voltage being applied to the memory cell.

17. An apparatus comprising:
a memory cell;
a comparator in electronic communication with the memory cell; and
a controller in electronic communication with the memory cell and the comparator, wherein the controller is operable to:
initialize the comparator to sense whether a threshold voltage of the memory cell has been reached; and
reinitialize the comparator, to sense a logic state stored by the memory cell based at least in part on the threshold voltage being reached.

18. The apparatus of claim 17, wherein the controller operable to initialize the comparator to sense whether the threshold voltage of the memory cell has been reached is further operable to:
program, based at least in part on the threshold voltage of the memory cell, a first voltage at an input of the comparator.

19. The apparatus of claim 17, wherein the controller operable to reinitialize the comparator to sense the logic state stored by the memory cell is further operable to:
program, based at least in part on a trip-point of the comparator and a reference voltage for reading the memory cell, a first voltage at an input of the comparator.

20. The apparatus of claim 19, further comprising:
a charge accumulator;
a voltage source in electronic communication with the charge accumulator; and
a capacitor located between the comparator and the charge accumulator and between the comparator and the voltage source, wherein the controller operable to program the first voltage at the input of the comparator is further operable to:
isolate the charge accumulator from the capacitor;
connect the voltage source to the capacitor, wherein the voltage source is associated with the reference voltage for reading the memory cell;
isolate the comparator and the voltage source from the capacitor; and
reconnect the charge accumulator to the capacitor.

* * * * *